(12) United States Patent  
Barton et al.

(10) Patent No.: US 10,838,559 B2  
(45) Date of Patent: *Nov. 17, 2020

(54) TOUCH SENSOR ELECTRODE WITH PATTERNED ELECTRICALLY ISOLATED REGIONS

(71) Applicant: 3M INNOVATIVE PROPERTIES COMPANY, St. Paul, MN (US)

(72) Inventors: Roger W. Barton, Afton, MN (US); Billy L. Weaver, Eagan, MN (US); Matthew W. Gorrell, South St. Paul, MN (US); Brock A. Hable, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 841 days.

This patent is subject to a terminal disclaimer.

(21) Appl. No.: 15/350,297

(22) Filed: Nov. 14, 2016

(65) Prior Publication Data

US 2017/0060306 A1   Mar. 2, 2017

Related U.S. Application Data

(63) Continuation of application No. 14/368,473, filed as application No. PCT/US2013/025564 on Feb. 11, 2013, now Pat. No. 9,529,481.

(Continued)

(51) Int. Cl.
*G06F 3/044* (2006.01)
*G06F 3/0488* (2013.01)

(Continued)

(52) U.S. Cl.
CPC ............ *G06F 3/044* (2013.01); *G06F 3/0488* (2013.01); *H01B 5/00* (2013.01); *H01B 5/14* (2013.01);

(Continued)

(58) Field of Classification Search
None
See application file for complete search history.

(56) References Cited

U.S. PATENT DOCUMENTS 5,126,007 A   6/1992   Shmulovich
5,492,611 A   2/1996   Sugama
(Continued)

FOREIGN PATENT DOCUMENTS

| CN | 101655754 | 2/2010 |
|---|---|---|
| EP | 2157500 | 2/2010 |
| JP | 2012-32955 | 2/2012 |

OTHER PUBLICATIONS

International Search Report for PCT International Application No. PCT/US2013/025564 dated May 7, 2013, 4 pages.

*Primary Examiner* — Alexander G Ghyka
(74) *Attorney, Agent, or Firm* — Clifton F. Richardson

(57) ABSTRACT

An electrode layer has a plurality of substantially parallel electrodes disposed along a first direction. At least one electrode has a length along the first direction and a width from a first edge to a second edge along a second direction transverse to the first direction. At least one electrode comprises across its width at least one edge section, at least one intermediate section, and at least one central section, wherein an intermediate section is disposed along the electrode width between an edge section and the central section. At least one electrode edge section and intermediate section includes a plurality of electrically isolated regions arranged in a pattern along the electrode length. An electrode conductive area of the edge section is less than an electrode conductive area of the intermediate section.

16 Claims, 16 Drawing Sheets

Related U.S. Application Data

(60) Provisional application No. 61/597,572, filed on Feb. 10, 2012.

(51) Int. Cl.
*H01B 5/00* (2006.01)
*H01B 5/14* (2006.01)
*H03K 17/96* (2006.01)

(52) U.S. Cl.
CPC . *H03K 17/962* (2013.01); *G06F 2203/04101* (2013.01); *G06F 2203/04103* (2013.01); *G06F 2203/04111* (2013.01); *G06F 2203/04112* (2013.01)

(56) References Cited

U.S. PATENT DOCUMENTS

| | | |
|---|---|---|
| 5,512,131 A | 4/1996 | Kumar |
| 6,297,811 B1 | 10/2001 | Kent |
| 6,775,907 B1 | 8/2004 | Boyko |
| 8,004,499 B2 | 8/2011 | Geaghan |
| 8,686,308 B2 | 4/2014 | Kuriki |
| 9,529,481 B2 | 12/2016 | Barton |
| 2007/0008299 A1 | 1/2007 | Hristov |
| 2007/0160811 A1 | 7/2007 | Gaides |
| 2009/0096757 A1 | 4/2009 | Hotelling et al. |
| 2009/0218310 A1 | 9/2009 | Zu |
| 2009/0219257 A1 | 9/2009 | Frey |
| 2010/0026664 A1 | 2/2010 | Geaghan |
| 2010/0214247 A1 | 8/2010 | Tang et al. |
| 2010/0220071 A1* | 9/2010 | Nishihara ............ G06F 3/0416 345/173 |
| 2010/0265210 A1 | 10/2010 | Nakanishi |
| 2010/0302201 A1 | 12/2010 | Ritter |
| 2011/0018557 A1 | 1/2011 | Badaye |
| 2011/0025639 A1 | 2/2011 | Trend |
| 2011/0100957 A1 | 5/2011 | Moran |
| 2011/0102370 A1 | 5/2011 | Kono |
| 2011/0111182 A1 | 5/2011 | Stay |
| 2011/0291963 A1 | 12/2011 | Woo |
| 2011/0310037 A1 | 12/2011 | Moran et al. |
| 2013/0207911 A1 | 8/2013 | Barton |

* cited by examiner

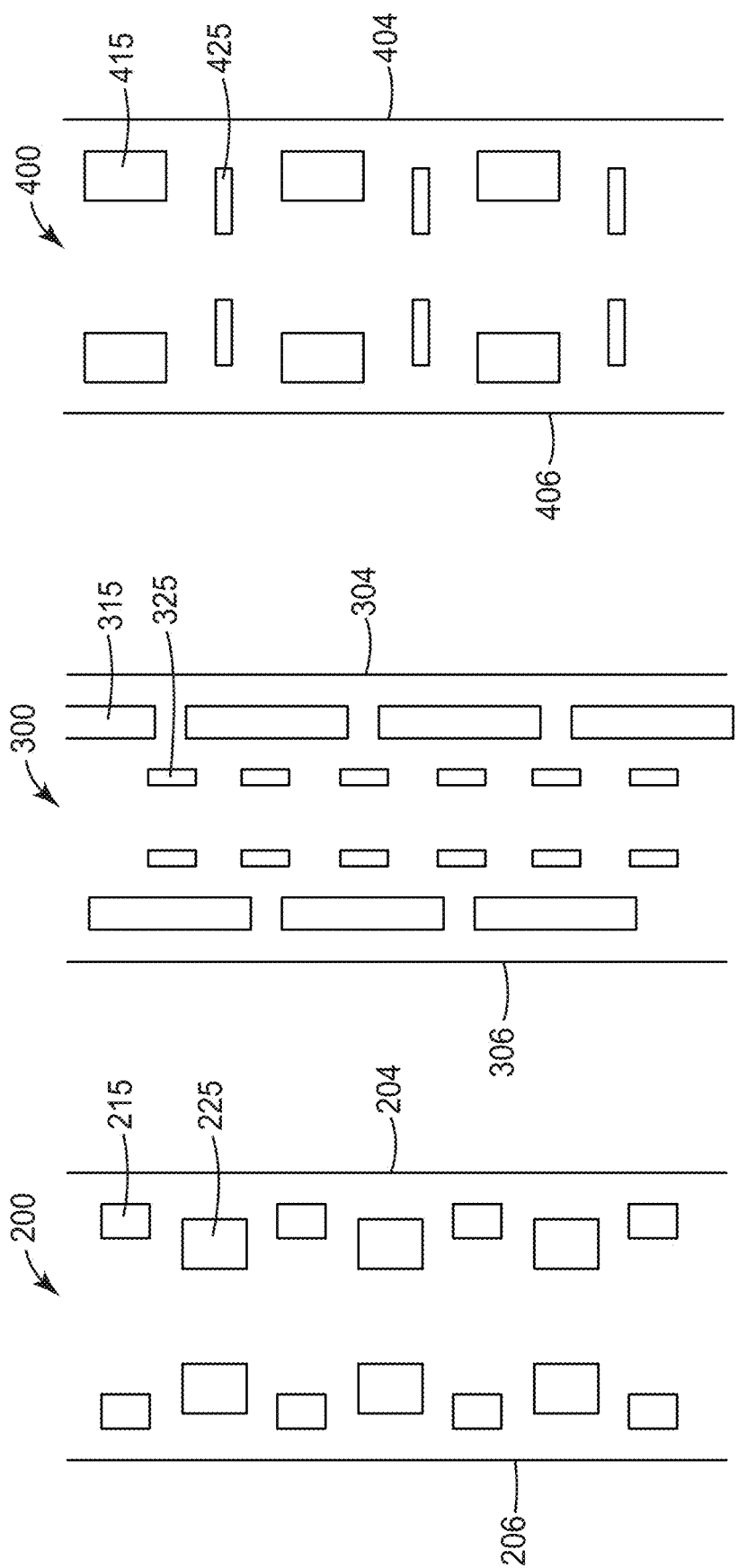

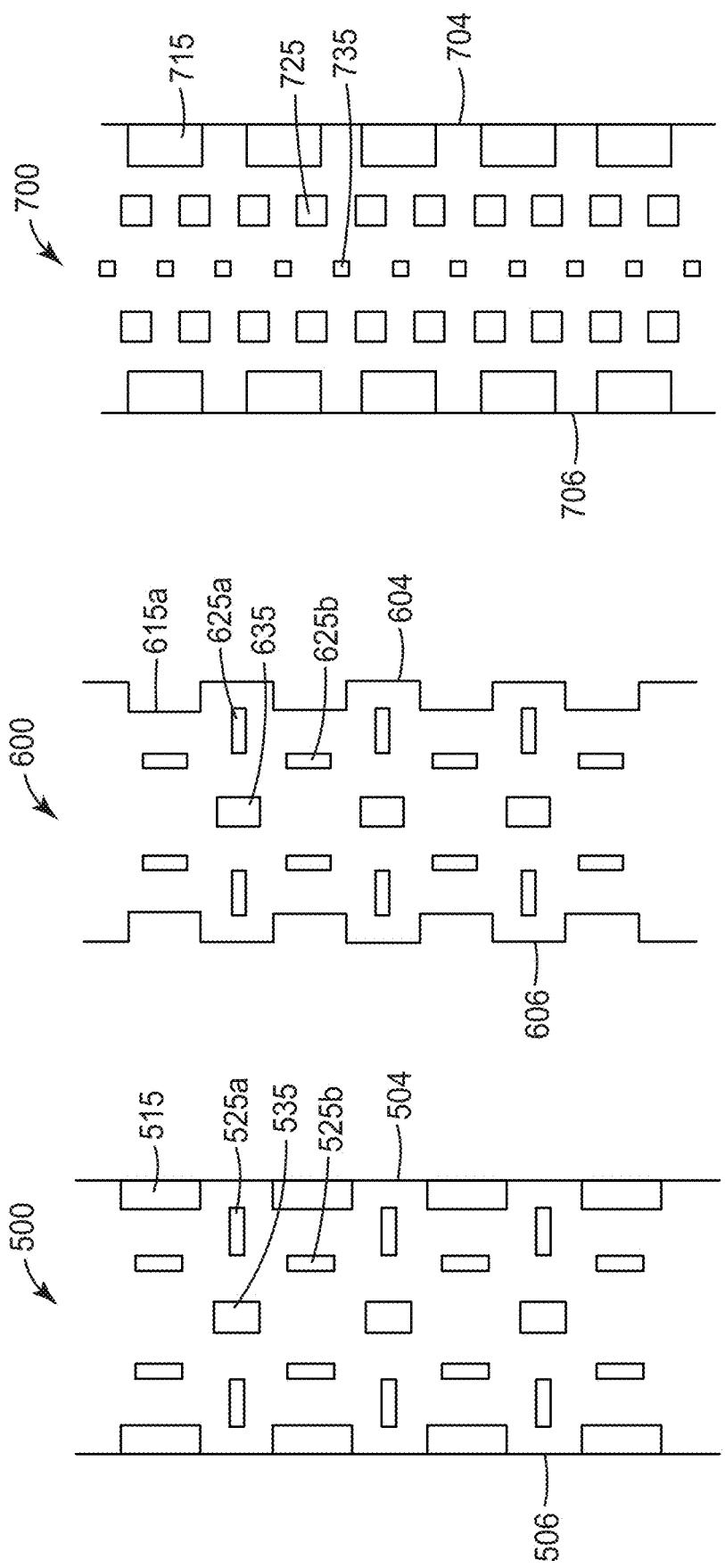

TOUCH SENSOR ELECTRODE WITH PATTERNED ELECTRICALLY ISOLATED REGIONS

BACKGROUND

Touch screen sensors detect the location of an object (e.g. a finger or a stylus) applied to the surface of a touch screen display or the location of an object positioned near the surface of a touch screen display. These sensors detect the location of the object along the surface of the display, e.g. in the plane of a flat rectangular display. Examples of touch screen sensors include capacitive sensors, resistive sensors, and projected capacitive sensors. Such sensors include transparent conductive elements that overlay the display. The elements are combined with electronic components that use electrical signals to probe the elements in order to determine the location of an object near or in contact with the display.

In the field of touch screen sensors, there is a need to have improved control over the electrical properties of the transparent touch screen sensors, without compromising optical quality or properties of the display. A transparent conductive region of a typical touch screen sensor includes a continuous coating of a transparent conducting oxide (TCO) such as indium tin oxide (ITO), the coating exhibiting electrical potential gradients based on the location or locations of contact to a voltage source and the overall shape of the region. This fact leads to a constraint on possible touch sensor designs and sensor performance, and necessitates such measures as expensive signal processing electronics or placement of additional electrodes to modify the electrical potential gradients. Thus, there is a need for transparent conductive elements that offer control over electrical potential gradients that is independent of the aforementioned factors.

There is an additional need in the field of touch screen sensors that relates to flexibility in the design of electrically conductive elements. The fabrication of touch screen sensors using patterned transparent conducting oxides (TCO) such as indium tin oxide (ITO) often places limitations on conductor design. The limitations relate to a constraint caused by patterning all of the conductive elements from a transparent sheet conductor that has a single value of isotropic sheet resistance.

There is also a need to design touch screen sensors that are capable of accurately locating a detection object (e.g., finger, stylus, etc.) of varying sizes. One existing approach is to provide a touch sensor with very narrow electrodes. However, this construction results in electrodes with high resistance (leading to reduced signal strength) and low manufacturing yield.

SUMMARY

According to one aspect of the invention, a touch screen sensor comprises an electrode layer having a plurality of substantially parallel electrodes disposed along a first direction, wherein at least one electrode has a length along the first direction and a width from a first edge to a second edge along a second direction transverse to the first direction, wherein at least one electrode comprises across its width at least one edge section, at least one intermediate section, and at least one central section, wherein an intermediate section is disposed along the electrode width between an edge section and the central section, wherein at least one electrode edge section and intermediate section includes a plurality of electrically isolated regions arranged in a pattern along the electrode length, wherein an electrode conductive area of the edge section is less than an electrode conductive area of the intermediate section.

The above summary of the present invention is not intended to describe each illustrated embodiment or every implementation of the present invention. The figures and the detailed description that follows more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 5A is a front view of an electrode according to another aspect of the invention.

FIG. 5B is a front view of an electrode according to another aspect of the invention.

FIG. 5C is a front view of an electrode according to another aspect of the invention.

FIG. 5D is a front view of an electrode according to another aspect of the invention.

FIG. 5E is a front view of an electrode according to another aspect of the invention.

FIG. 5F is a front view of an electrode according to another aspect of the invention.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Figure 1:
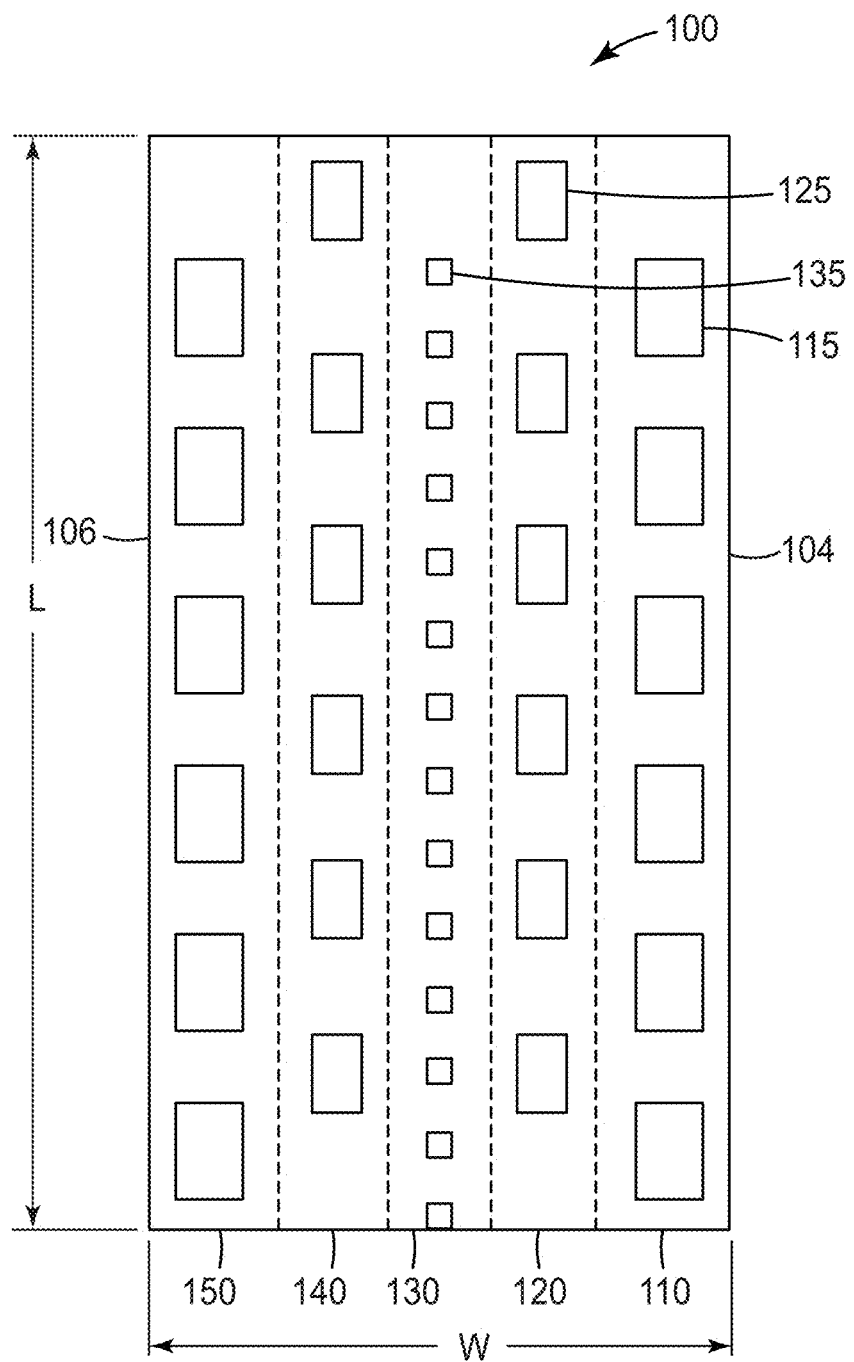
FIG. 1 is a front view of an electrode according to a first aspect of the invention.

In the following description, reference is made to the accompanying set of drawings that form a part hereof and in which are shown by way of illustration several specific embodiments. It is to be understood that other embodiments are contemplated and may be made without departing from the scope or spirit of the present invention. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the context clearly dictates otherwise. As used in this specification and the appended claims, the term "or" is generally employed in its sense including "and/or" unless the context clearly dictates otherwise.

As used herein, "visible light transparent" refers to the level of transmission being at least 60 percent transmissive to at least one polarization state of visible light, where the percent transmission is normalized to the intensity of the incident, optionally polarized light. It is within the meaning of visible light transparent for an article that transmits at least 60 percent of incident light to include microscopic features (e.g., dots, squares, or lines with minimum dimension) that block light locally to less than 80 percent transmission (e.g., 0 percent); however, in such cases, for an approximately equiaxed area including the microscopic feature and measuring 1000 times the minimum dimension of the microscopic feature in width, the average transmittance is greater than 60 percent.

The present disclosure relates to touch screen sensors with electrical and optical properties that are engineered through design of conducting electrode materials or electrode layers described herein. In particular, as described herein, an electrode layer has a plurality of substantially parallel electrodes disposed along a first direction. At least one electrode (or, in some cases, all of the electrodes forming the layer) has a length along the first direction and a width from a first edge to a second edge along a second direction transverse to the first direction. At least one electrode (or, in some cases, all of the electrodes forming the layer) comprises across its width at least one edge section, at least one intermediate section, and at least one central section, wherein an intermediate section is disposed along the electrode width between an edge section and the central section. At least one electrode edge section and intermediate section (or, in some cases, all of the electrode edge sections and intermediate sections of the electrode layer) includes a plurality of electrically isolated regions arranged in a pattern along the electrode length. An electrode conductive area of the edge section is less than an electrode conductive area of the intermediate section.

In one aspect of the invention, the electrically isolated regions are distributed in size and location to create a density distribution of conductive area that is denser in the center of the sensor electrode and less dense at the outside edge of the sensor electrode. This structure allows for more accurate interpolation of touch position—especially useful in cases where small touch objects such as a stylus or child's finger is used.

There are several advantages that are created for touch screen sensors by the incorporation of the electrode layers described herein. In some embodiments, an average electrode width can be kept so that electrode resistance is relatively low. The fine pattern of electrically isolated interior regions creates a contact area gradient from one electrode edge to the center of the electrode, or from one edge to the other electrode edge. This electrode structure can provide better accuracy, even with smaller detection objects, for contact or proximity sensors for touch input of information or instructions into electronic devices (e.g., computers, tablets, cellular telephones, etc.) These sensors are visible light transparent and useful in direct combination with a display, overlaying a display element, and interfaced with a device that drives the display (as a "touch screen" sensor).

The sensing area of a touch sensor is that region of the sensor that is intended to overlay, or that overlays, a viewable portion of an information display and is visible light transparent in order to allow viewability of the information display. Viewable portion of the information display refers to that portion of an information display that has changeable information content, e.g. the portion of a display "screen" that is occupied by pixels, e.g. the pixels of a liquid crystal display.

This disclosure further relates to touch screen sensors that are of the resistive, capacitive, and projected capacitive types. The electrode layers described herein can be utilized in projected capacitive touch screen sensors that are integrated with electronic displays. As a component of projected capacitive touch screen sensors, the electrode layers are useful for enabling high touch sensitivity, multi-touch detection, and stylus input.

FIG. 1 shows a first aspect of the present invention, an electrode layer 100, also referred to herein simply as electrode 100. Electrode 100 is generally provided in an elongated or strip shape, having a length "L" and a width "W" measured from edge to edge (here edge 104 and edge 106) that is typically much shorter than the length. In a typical application, such as in a touch sensor used for a display, L can be from about 20 mm to about 3000 mm, and W can be from about 1 mm to about 10 mm. The pitch or spacing between adjacent electrodes of the electrode layer can be from about 1 mm to about 10 mm.

Electrode 100 includes a plurality of electrically isolated regions located in different sections of the electrode. In this example, five separate electrode sections are identified: a first edge section 110, a second (intermediate) section 120, a third (central) section 130, a fourth (intermediate) section 140, and a fifth (edge) section 150. Each section stretches the length of the electrode 100. While the width of each section in FIG. 1 is about the same for each electrode section, in other aspect, the width of each individual section can vary. In addition, a greater or lesser number of electrode sections can be utilized.

In the example of FIG. 1, a first set or group of electrically isolated regions, such as electrically isolated region 115, are formed in edge section 110. A second set of electrically isolated regions, such as electrically isolated region 125, are formed in intermediate section 120. A third set of electrically isolated regions, such as electrically isolated region 135, are formed in center section 130. Fourth and fifth sets of electrically isolated regions are formed in sections 140 and 150, but are not identified for simplicity. The remaining electrode material excluding the electrically isolated regions serves as the active electrode in electrical communication with the touch sensor circuitry, through an electrical lead attached to each respective electrode (not shown.) The surface area of this remaining electrode material of the electrode, or in a section of the electrode, will be referred to herein as the electrode conductive area, or sometimes simply the conductive area. However, it is to be understood that the isolated regions may also contain conductive material, but this electrically isolated conductive material does not contribute to the conductive properties or active sensor response of the electrode.

These electrically isolated regions can comprise the complete absence of conductive material or a patch of conductive material that is isolated from the electrode. Several embodiments of electrically isolated regions are described in further detail below. In addition, the size of an electrically isolated region can vary depending on the electrode width. For example, in some aspects, the size of an electrically isolated region can vary from about 50 micrometer by 50 micrometer (0.05 mm) (e.g., for a small center section electrically isolated region) to up to about 2 mm by 2 mm (e.g., for a larger electrically isolated region located in an edge section of the electrode). In some aspects, a size of each electrically isolated interior region is less than a size of a detection object.

As shown in FIG. 1, each group of electrically isolated regions has a plurality of individual electrically isolated regions each having a distinct shape. The plurality of electrically isolated regions can have, in some aspects, a repeating distribution pattern across a given section of the electrode. In other aspects, the plurality of electrically isolated regions can be randomly placed within and along a given section. In this configuration, the overall density of the interior regions and the remaining connected, conducting electrode material can have the effect of yielding sections with a distinct density across a given section. Moreover, the shape of the electrically isolated regions is not limited to the rectangular shaped isolated regions shown in the figures.

In addition, a distribution of the electrically isolated regions can be varied to produce a density difference in total electrically isolated region area between an edge section and a center section. In some aspects, a specific distribution of density can be achieved by changing the population of similar sized small electrically isolated regions. For example, many small electrically isolated regions can be disposed in an edge section, while fewer small electrically isolated regions can be disposed in the center section. These structures provide for the electrode to have a distributed density of conductive area. As shown below, these specifi-cally engineered regions present varying densities of electrode material to a detection object as it moves across an electrode in a transverse (edge-to-edge) direction. Thus, the amount of overlap between the electrode and the detection object can be precisely defined according to the object's location across the transverse axis of the electrode.

In the example of FIG. 1, a group of electrically isolated regions 115 are disposed in section 110, an edge section of the electrode 100 (i.e., a section bounded by an edge, here edge 104). The electrically isolated regions 115 can have a relatively large size in comparison to electrically isolated regions 125 and 135. In this aspect, edge section 110 has less of an electrode conductive area than its neighboring intermediate section 120. Similarly, the electrically isolated regions 125 can have a relatively large size in comparison to electrically isolated regions 135. In this aspect, intermediate section 120 has less of an electrode conductive area than its neighboring central section 130, but more than its neighboring edge section 110.

Figure 7A:
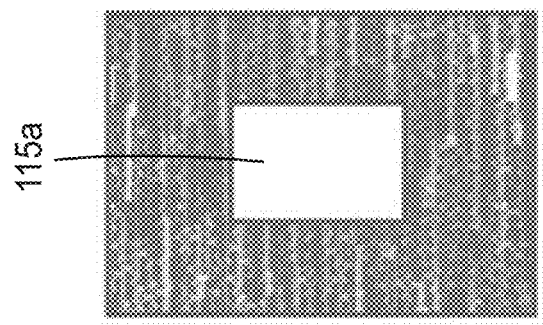
FIGS. 7A-7C are illustrations of different types of electrically isolated regions according to other aspects of the present invention.
Figure 7B:
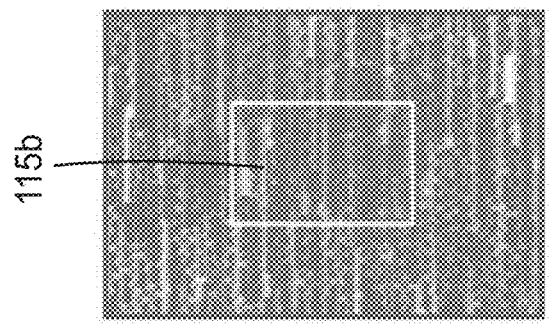
Figure 7C:
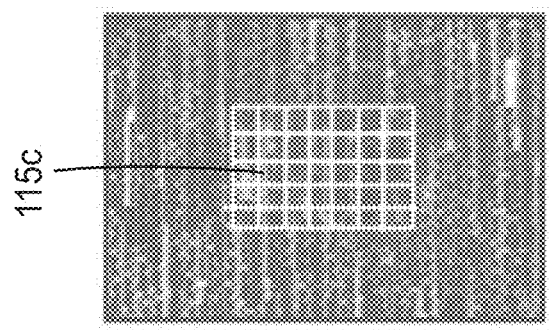

The electrically isolated regions 115, 125, 135 can have varying shapes or patterns (as seen in the many embodiments described herein). In particular, FIGS. 7A-7C show three different electrically isolated region designs. In FIG. 7A, the electrically isolated region 115a is simply a hole, devoid of conductive material. In contrast, in FIG. 7B, the electrically isolated region 115b comprises a region of conductive material that is isolated from the main electrode by a gap of, for example, from about 1 micrometer to about 20 micrometers. In another alternative construction, such as shown in FIG. 7C, the electrically isolated region 115c comprises a region of broken, floating conductive material that is isolated from the main electrode. The electrically isolated regions can be formed of conductive material, as is shown in FIGS. 7B and 7C, but these regions are not in electrical communication with the rest of the electrode, and are thus not considered an electrode conductive area. As would be apparent to one of ordinary skill in the art given the present description, other electrically isolated region configurations can be utilized. Moreover, electrically isolated regions can have rectangular, circular, elliptical, triangular, or other polygonal shapes. In a further alternative aspect, the electrically isolated regions within the same electrode section do not have to share the same shape, but can comprise a pattern of varying shapes. Also, in yet another alternative aspect, an electrically isolated region can span across more than one electrode section (see e.g., FIG. 5D). The electrically isolated regions can be formed using one or more of the patterning processes described in more detail below.

Electrode 100 is formed from a conductive material. In some aspects, the conductive material comprises a metal. Examples of useful metals for forming the electrode include gold, silver, palladium, platinum, aluminum, copper, nickel, tin, alloys, and combinations thereof. In some embodiments the electrode can be formed from a transparent oxide material, such as indium tin oxide (ITO), a transparent conducting organic materials (e.g. PEDOT), thick-film nano-wire materials (e.g. silver nano-wires from Cambrios Corp or carbon nano-tubes), and micro-patterned mesh materials (such as is described in U.S. patent application Ser. No. 13/689,935, incorporated by reference herein in its entirety). The conductor may have a thickness between 5 nanometers and 5 micrometers, or between 10 nanometers and 500 nanometers, or between 15 nanometers and 250 nanometers. In many embodiments, the thickness of the conductor is less than one micrometer. In some aspects, a desired thickness for the conductor can be calculated by starting with the desired sheet resistance and considering the layer geometry (and in turn its effect on the current-carrying cross-section in the plane) and the bulk resistivity of the conductor, as is known in the art. For complicated geometries, there are computational methods in the art, e.g. finite difference methods or finite element methods that can be used to calculate sheet resistance. Sheet resistance can be measured using a number of techniques, including four-point probe techniques and non-contact eddy-current methods, as are known in the art.

The electrode layer can be formed on the surface of a visible light transparent substrate. The light transmissive substrate may comprise of any of a wide variety of non-polymeric materials, such as glass, or various thermoplastic and crosslinked polymeric materials, such as polyethylene terephthalate (PET), (e.g. bisphenol A), polyethylene naphthalate (PEN), polycarbonate, cellulose acetate, poly(methyl methacrylate), and polyolefins such as biaxially oriented polypropylene which are commonly used in various optical devices. Further, the substrate may comprise a hybrid material, having both organic and inorganic components.

The contact area on a touch screen can vary with the size of the object (e.g., human finger, stylus, or other object) touching the screen. The contact area becomes more important when the size of the contact area approaches the width of the sensor electrode, affecting the accuracy of location of the contact or touch.

Examples of useful displays with which sensors of the invention can be integrated include liquid crystal displays, cathode ray tube displays, plasma display panels, and organic light emitting diode displays.

Figure 2A:
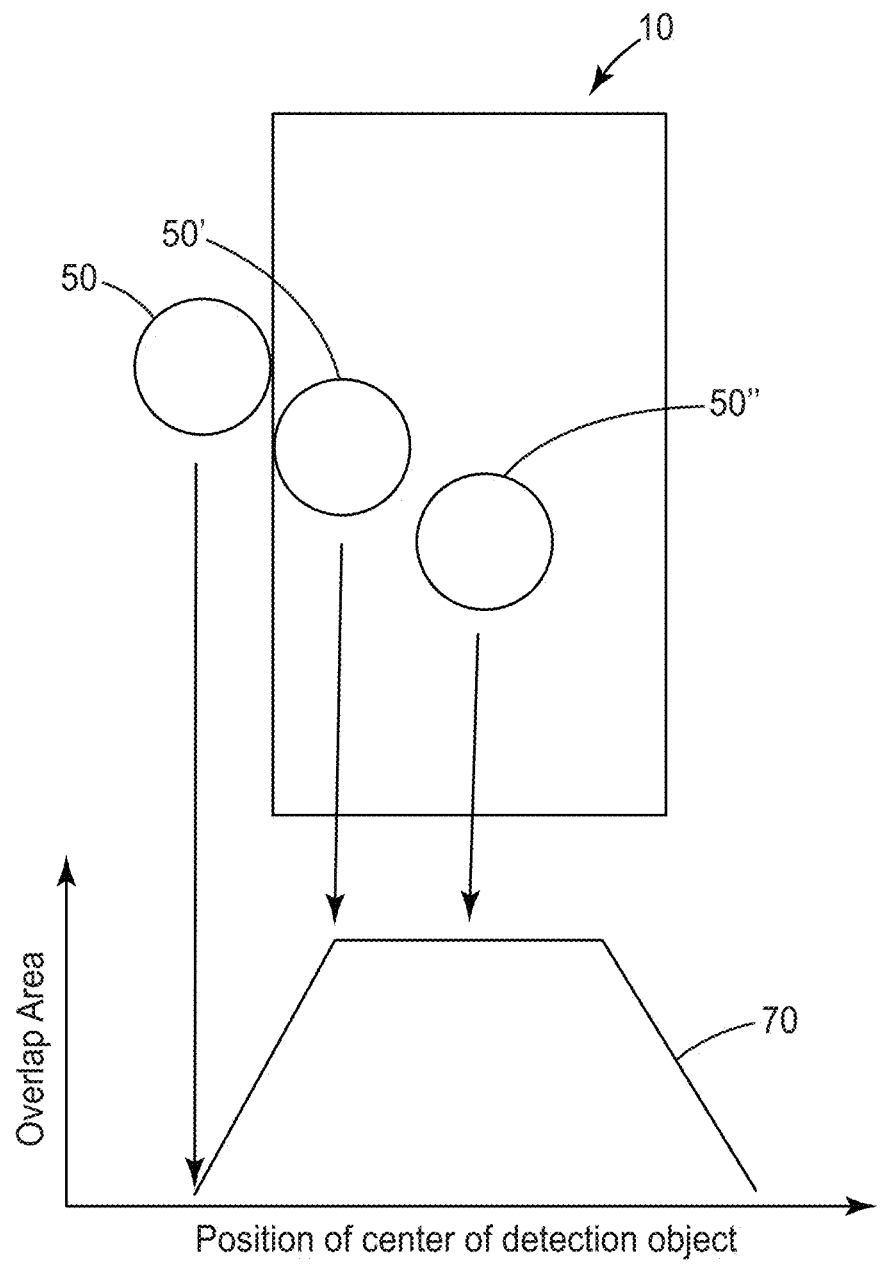
FIG. 2A is an illustration of a small detection object at different locations across a typical electrode, and its corresponding response curve.

As mentioned previously, a problem with conventional electrode designs is that as the detection object gets smaller in size, accurately determining the detection object location can be difficult. For example, as shown in FIG. 2A, a small detection object is shown in various positions (50, 50', 50") across a typical electrode 10. Below the electrode, the response curve is shown. The response curve 70 illustrates the overlap area of the detection object and the conductive electrode area as a function of the center of the detection object. In this example, a small detection object, of about 3 mm in diameter (such as a small stylus or child's finger) is being used. The electrode 10 has a standard electrode construction of uniform conductive area and width (e.g., having a width of >5 mm). As shown in FIG. 2A, the overlap area reaches a maximum at position 50', but does not change as the detection object moves across the electrode 10 to position 50". As such, the position of the detection object is not accurately resolved.

Figure 2B:
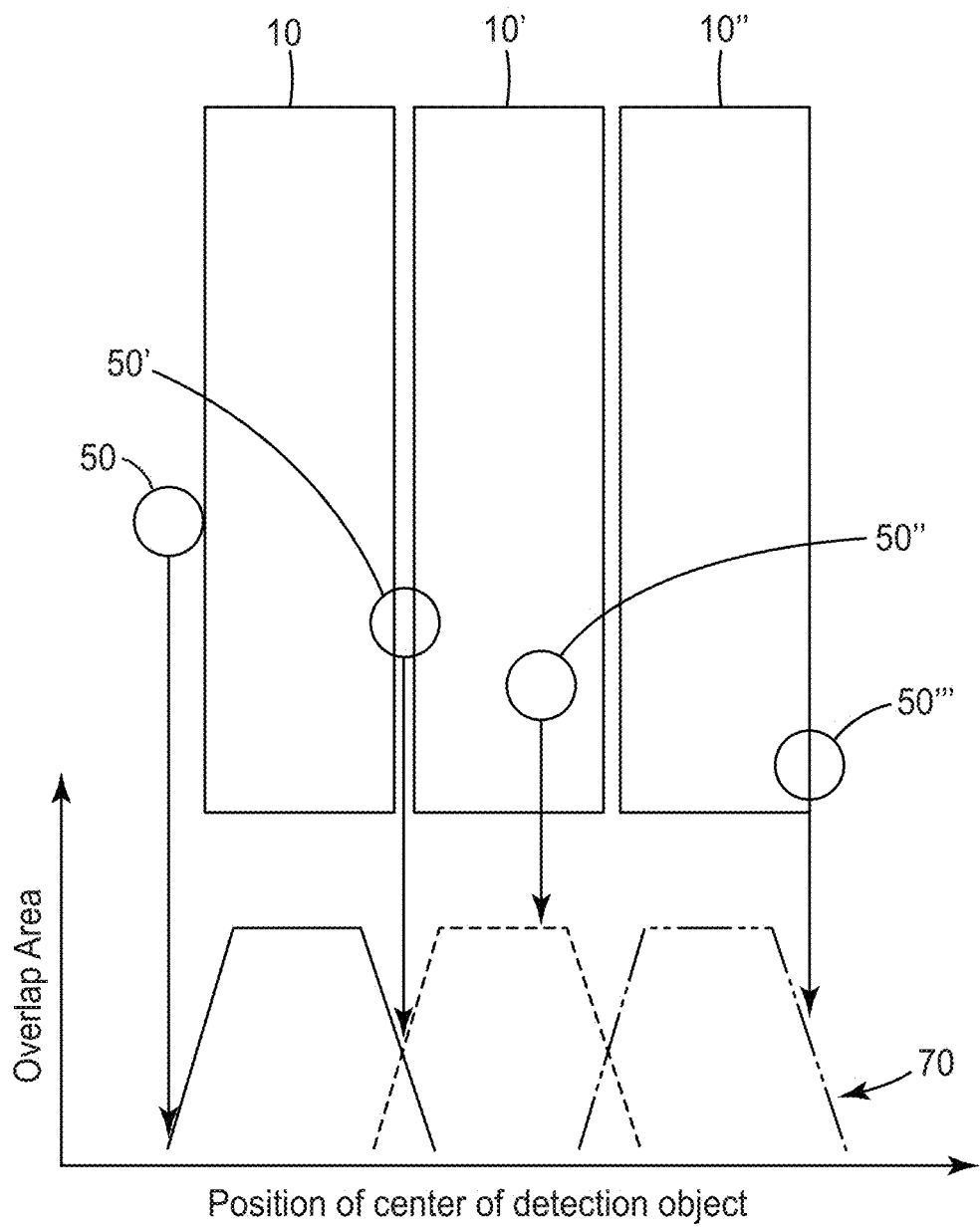
FIG. 2B is another illustration of a small detection object at different locations across several typical electrodes, and the corresponding response curve.

As shown in FIG. 2B, three standard electrodes 10, 10' 10" are provided in an electrode layer having a very narrow pitch. A small detection object, of about 3 mm in diameter (such as a small stylus or child's finger) is being used. As the detection object moves across multiple electrodes (see e.g., positions 50, 50', 50", and 50''') the response curve 70 shows that the overlap area remains constant while the object is entirely within the width of each electrode.

Figure 2C:
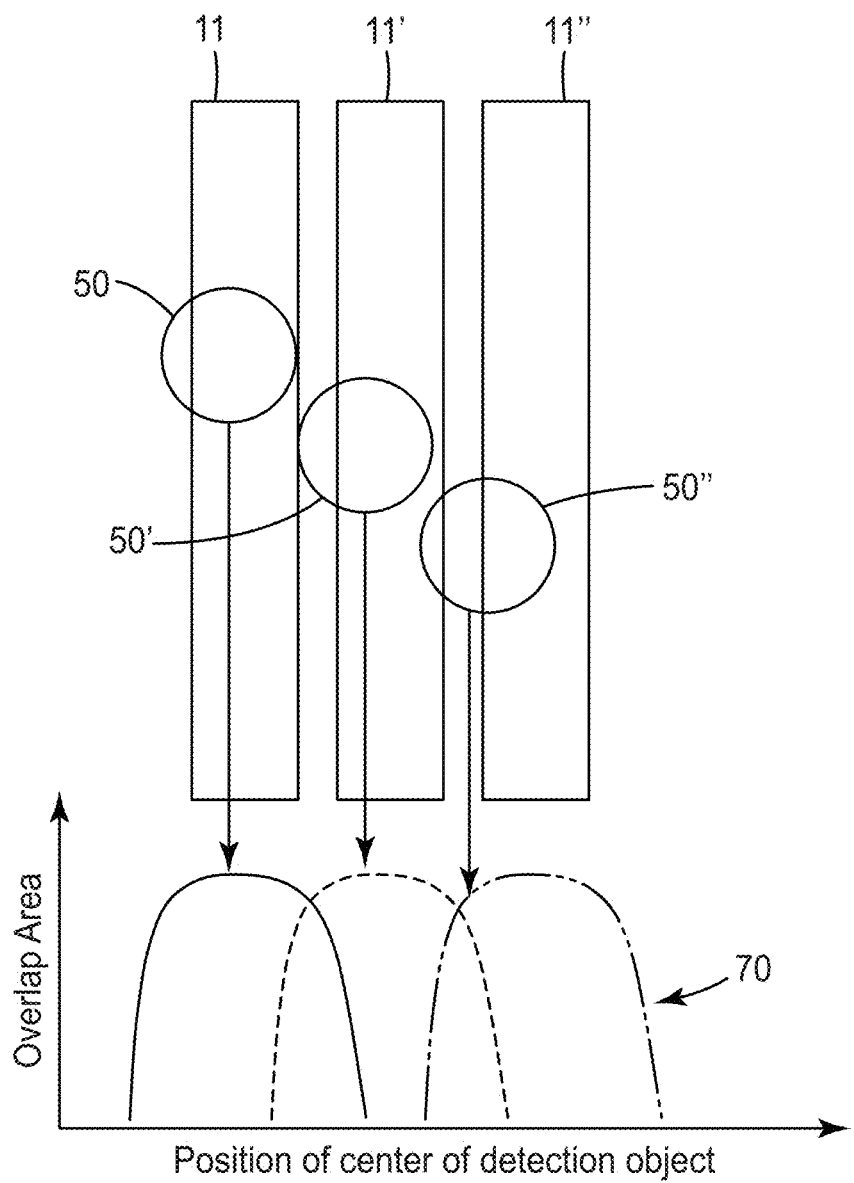
FIG. 2C is another illustration of a small detection object at different locations across several typical narrow electrodes, and the corresponding response curve.

One conventional approach to solving this resolution problem has been to provide narrow electrodes (<1 mm-2 mm) disposed with a narrow pitch (<1 mm-2 mm). As shown in FIG. 2C, a small detection object, of about 2 mm-3 mm in diameter (such as a small stylus or child's finger) is being used. As the detection object (see e.g., positions 50, 50', 50") moves across multiple electrodes 11, 11', 11", the corresponding response curves 70 indicate that the overlap area remains constant while the object is entirely within the width of each electrode. In addition, the narrow electrodes create a high resistance, and a high number of such high resistance electrodes makes electronic control more complex, slow to operate, and more expensive.

Figure 2D:
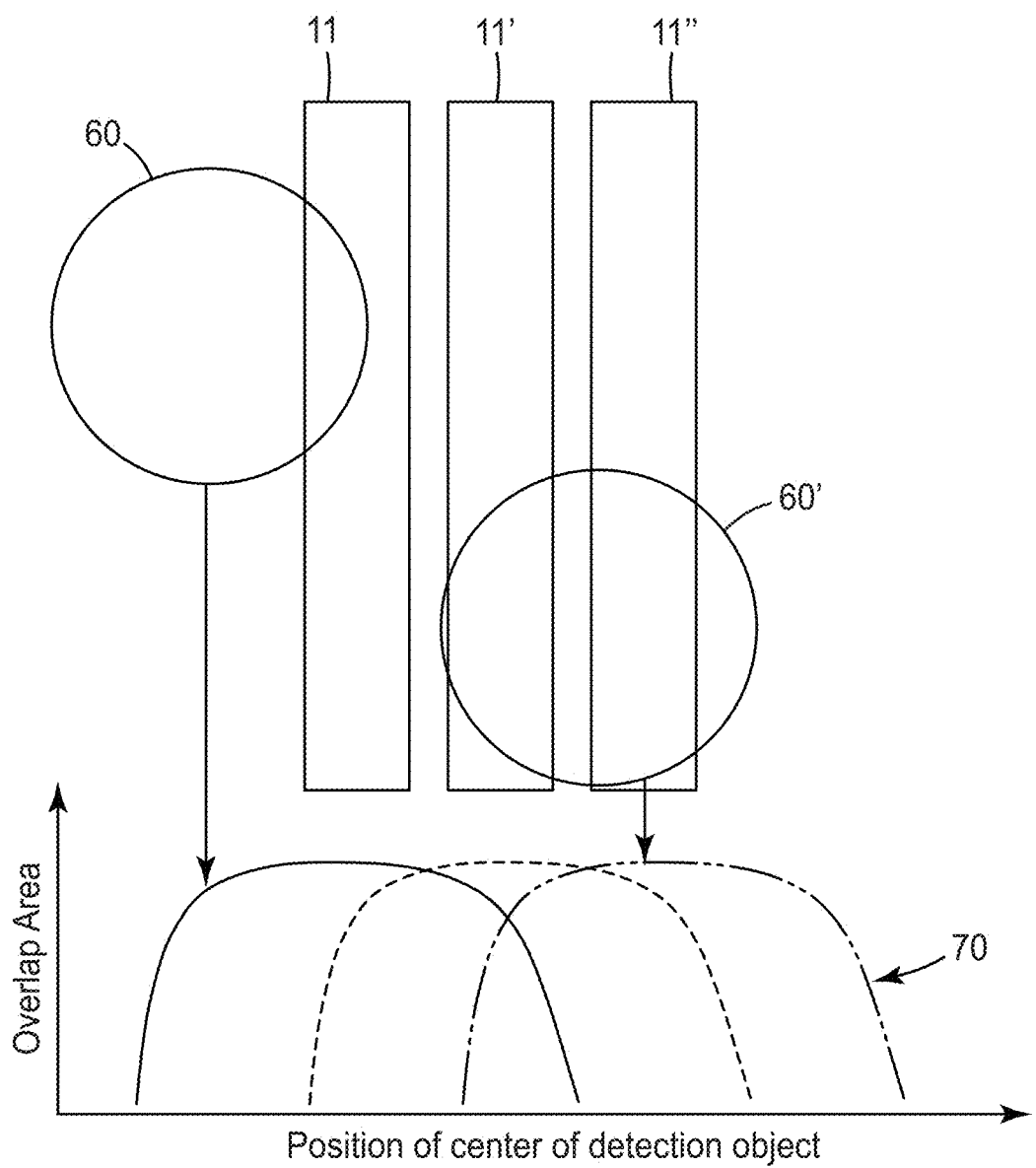
FIG. 2D is an illustration of a large detection object.

This conventional approach remains problematic for large size detection objects. For example, as shown in FIG. 2D, a large detection object, e.g., an adult finger having a diameter greater than 12 mm, is utilized. As the detection object (see positions 60, 60') moves across multiple narrow electrodes 11, 11', 11", the corresponding response curves 70 indicate that this condition presents problems resolving detection object position when overlap area from multiple electrodes is at the maximum value.

Figure 3A:
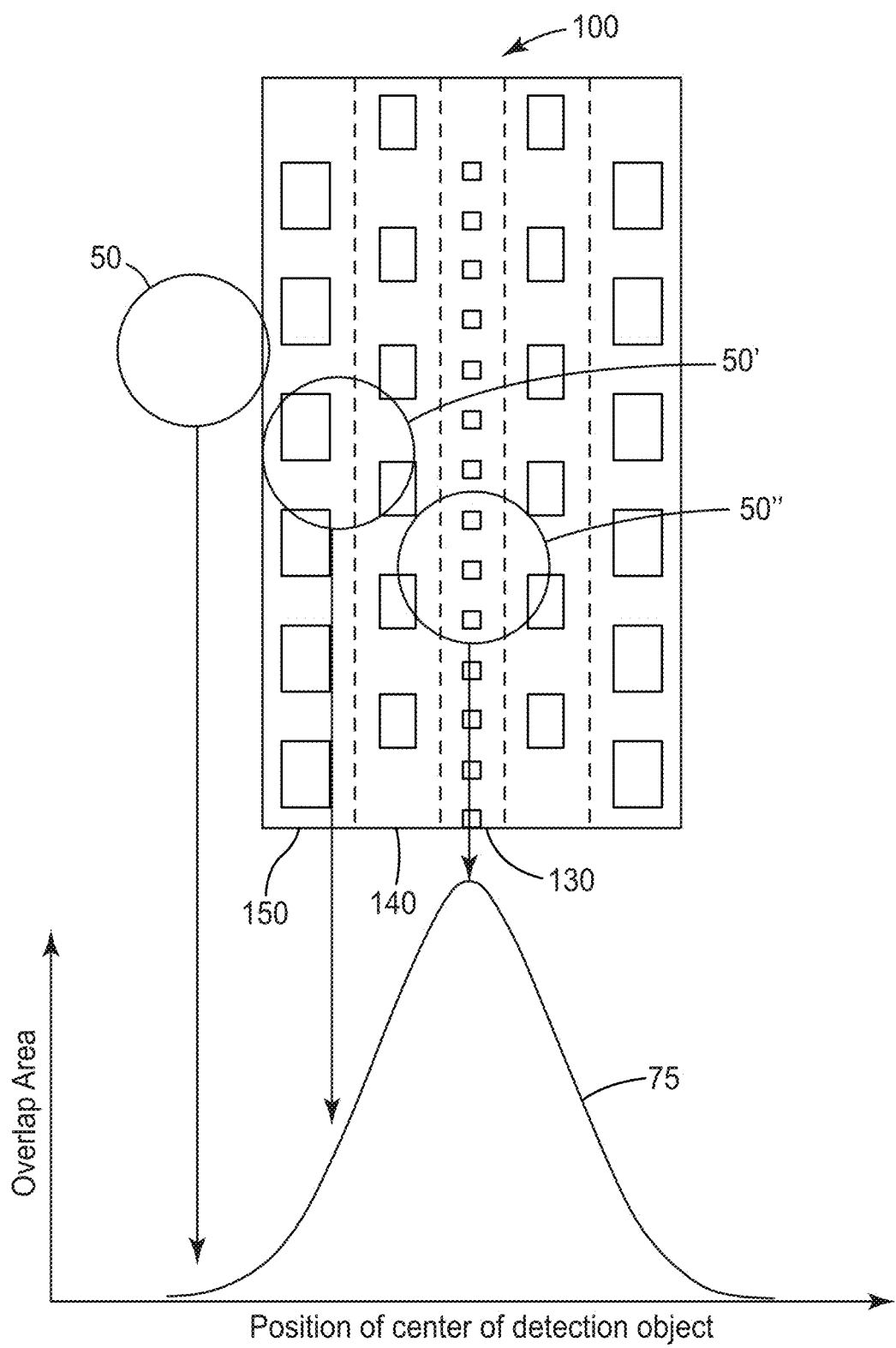
FIG. 3A is an illustration of a detection object at different locations across the electrode of FIG. 1 according to an aspect of the present invention, and the corresponding response curve.

As mentioned previously, a distributed density electrode, such as electrode 100, has specifically engineered regions that present varying densities of electrode conductive material to the detection object as it moves across the electrode in the transverse direction. FIG. 3A shows another view of electrode 100. In this example, a small detection object is shown in various positions (50, 50', 50") across electrode 100. Below the electrode, the response curve is shown. The response curve 75 illustrates the overlap area of the detection object and the conductive electrode area as a function of the center of the detection object. In this example, a small detection object, of about 3 mm in diameter (such as a small stylus or child's finger) is being used. When the detection object is outside the edge 106 of electrode 100 (position 50), there is no overlap indicated in the response curve 75. When the detection object is positioned over section 150/section 140 of electrode 100 (position 50'), there is some overlap indicated in the response curve 75. When the detection object is positioned over the center section 130 of electrode 100 (position 50"), there is maximum overlap indicated in the response curve 75. Because the electrode has varying degrees of conductivity as a function of the detection object's position with respect to edge of the electrode, a sharper response curve 75 (nearly Gaussian in shape) is generated, whereby the overlap area reaches a maximum only at the center of the electrode 100. In this manner, while there will be some non-zero overlap, the change in overlap area from the lowest point to the highest can be maximized. Thus, the detection object at position 50' presents a different overlap area than the detection object at position 50", enhancing the ability to interpolate the true "touch" position for more accurate results.

Figure 3B:
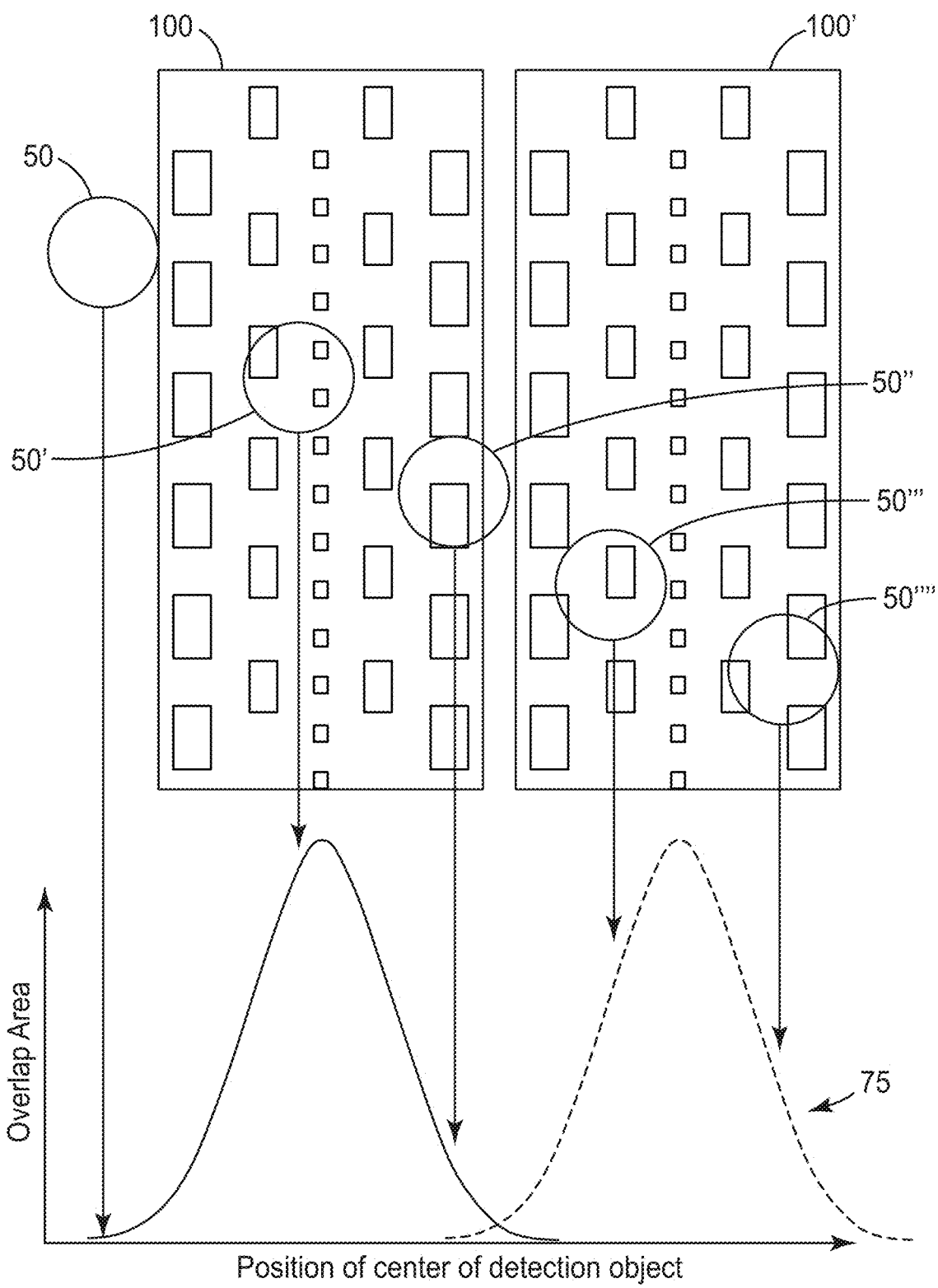
FIG. 3B is an illustration of a detection object at different locations across a couple of electrodes configured similarly to the electrode of FIG. 1 according to an aspect of the present invention, and the corresponding response curve.

FIG. 3B shows two closely spaced, substantially parallel electrodes 100 and 100'. In this example, a small detection object is shown in various positions (50, 50', 50", 50''', 50'''') across the electrodes 100, 100'. Below the electrodes, the response curve 75 is shown. The response curve 75 illustrates the overlap area of the detection object and the conductive electrode area as a function of the center of the detection object. In this example, a small detection object, of about 3 mm in diameter (such as a small stylus or child's finger) is being used. When the small detection object is outside the edge of electrode 100 (position 50), there is no overlap indicated in the response curve 75. When the detection object is positioned over the center section of electrode 100 (position 50'), there is maximum overlap indicated in the response curve 75. When the detection object is positioned over the far edge section of electrode 100 (position 50"), there is a smaller, non-zero overlap indicated in the response curve 75. When the detection object is positioned over an intermediate section of electrode 100' (position 50'''), there is a substantial overlap indicated in the response curve 75. When the detection object is positioned between the far intermediate and edge sections of electrode 100' (position 50''''), there is a slightly smaller overlap indicated in the response curve 75. Because the electrode has varying degrees of conductivity as a function of the detection object's position with respect to an edge of the electrodes, a sharper response curve 75 (nearly Gaussian in shape) is generated, whereby the overlap area reaches a maximum only at the center of the electrode 100, 100', and distinct non-zero overlap values can be measured when the detection object is located between the electrodes 100, 100', thus allowing for more accurate location of the "touch." Similarly, although not shown, the sharper response curves provide for more accurate position detection for larger detection objects as well. Narrow spacing can cause some resolution and resistance problems as well.

Figure 3C:
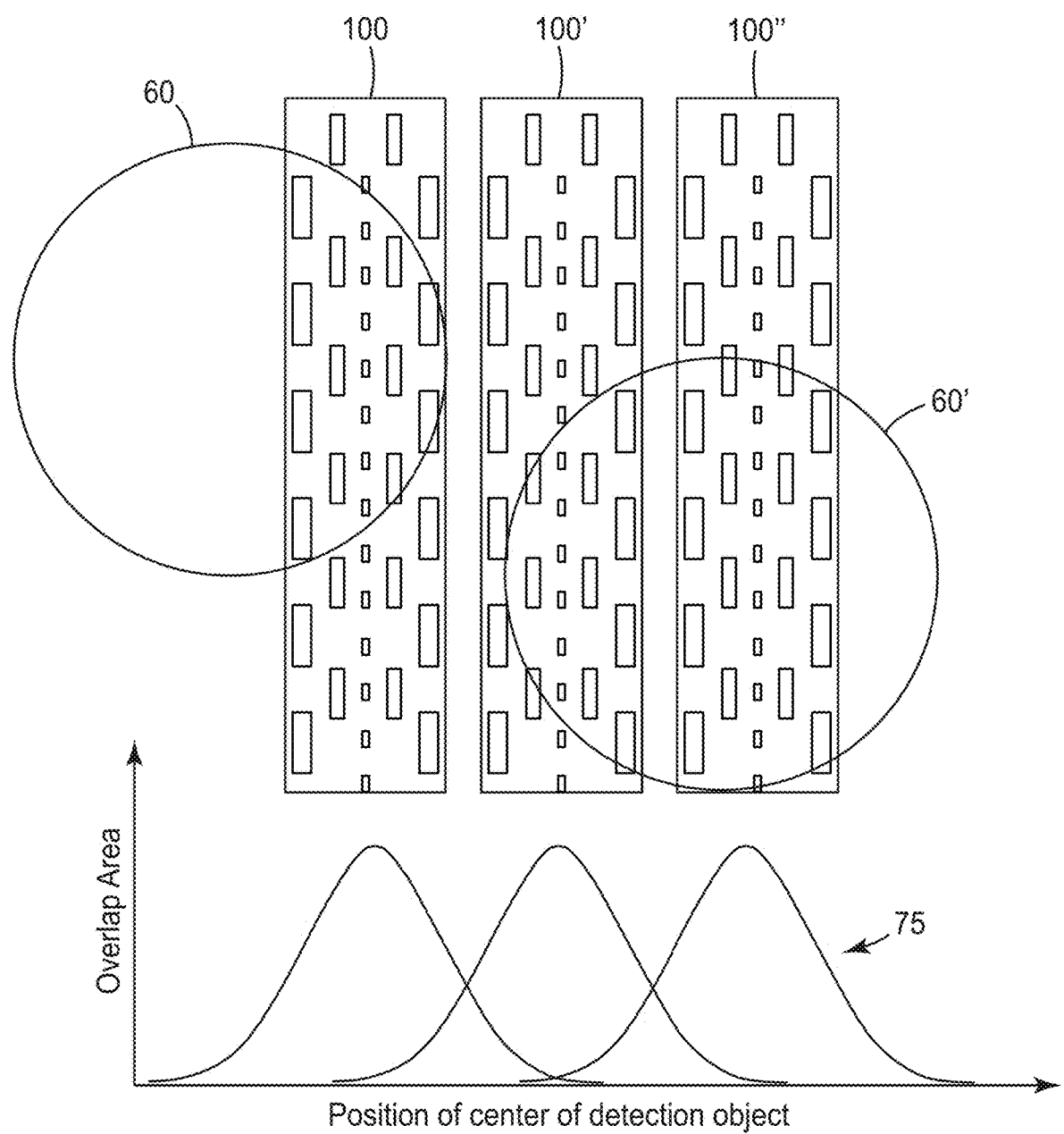
FIG. 3C is an illustration of a large detection object at different locations across several electrodes configured similarly to the electrode of FIG. 1 and spaced closely together.

FIG. 3C shows three closely spaced, substantially parallel, closely spaced electrodes 100, 100', 100". In this example, a large detection object is shown in various positions (60, 60') across the electrodes 100, 100', 100". Below the electrodes, the response curve 75 is shown. The response curve 75 illustrates the overlap area of the detection object and the conductive electrode area as a function of the center of the detection object. In this example, a large detection object, of about 12 mm to about 14 mm in diameter (such as an adult finger) is being used. When the large detection object is positioned near an edge of electrode 100 (position 60), there is some overlap indicated in the response curve 75. When the detection object is positioned over the center section of electrode 100" (position 60'), there is physical overlap of electrode 100' and 100", resulting in a maximum value indicated in the response curve 75. Because the electrode has varying degrees of conductivity as a function of the detection object's position with respect to an edge of the electrodes, a sharper response curve 75 is generated. Compared with the response curve shown in FIG. 2D, there exists more non-maximum overlap values between the response curves with the configuration of FIG. 3C, thus allowing for more accurate location of the "touch," although increased spacing distances between adjacent electrodes may yield more preferable results in some applications.

Figure 4:
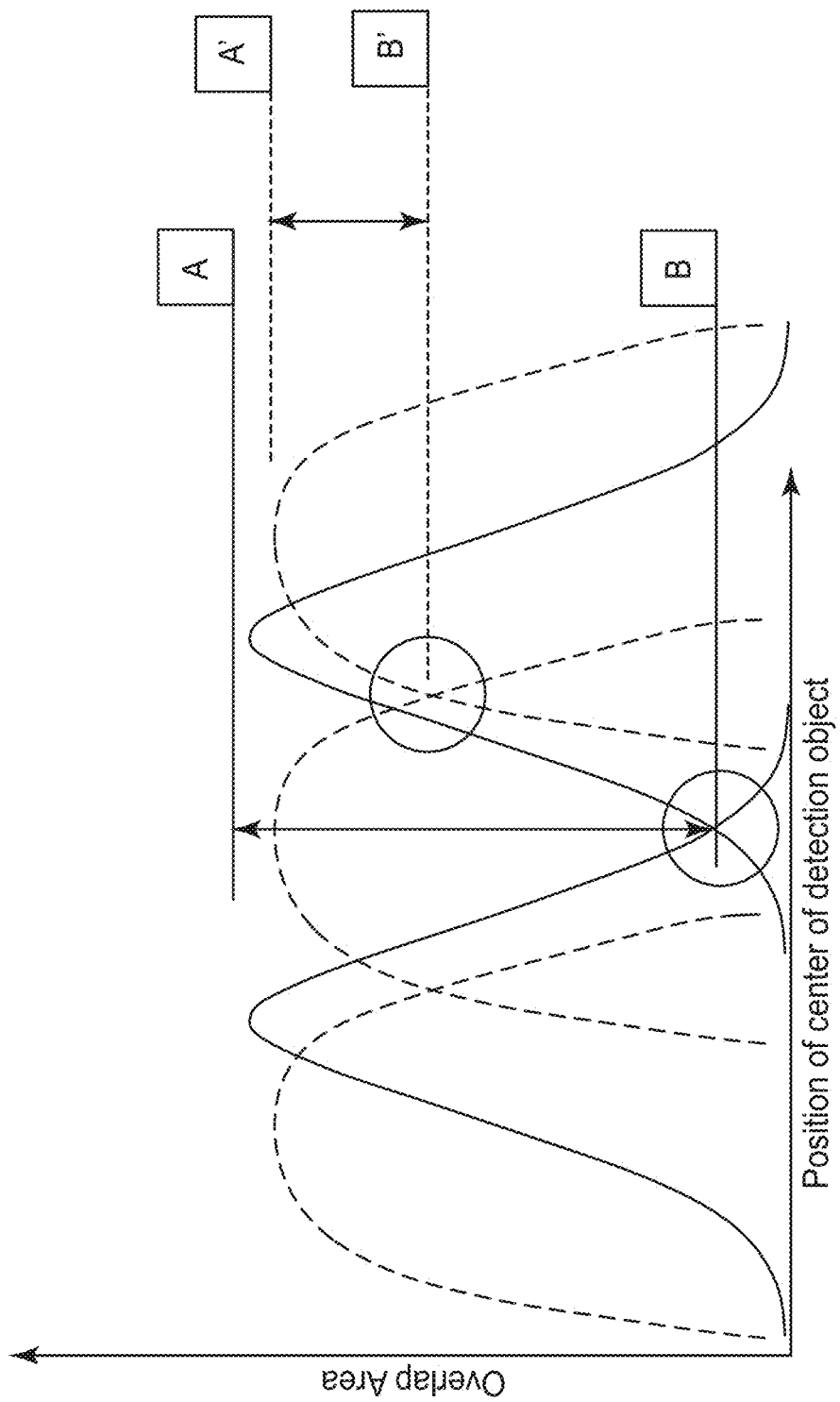
FIG. 4 is a response curve comparing the shapes of the response curves of typical electrodes (dotted lines) versus the response curves of electrodes configured in accordance with an aspect of the present invention.

FIG. 4 shows a comparison of a response curve of a standard uniform density electrode (dotted lines) versus the response curve of a distributed density electrode configured in accordance with an aspect of the present invention (solid line). For the distributed density electrode, the shape of the solid response curve is concentrated more towards the center of the electrode, which can be a benefit to the electronic controller, as the change in overlap area as the detection object passes from one electrode to the next helps define the detection object position accurately, as the location of a touch is calculated via an interpolation algorithm that uses the predetermined shape of the response curve to solve for the current location.

In addition, the response curve of a distributed density electrode exhibits a much greater difference in maximum overlap area (shown by the vertical distance from A to B) than the maximum overlap area difference (shown by the vertical distance A' to B') for the standard electrode configuration. Thus, an electrode layer having a multiple distributed density electrodes can provide for more accurate object position information.

Conductor patterns according to the invention can be generated by any appropriate patterning method, e.g. methods that include photolithography with etching or photolithography with plating (see, e.g., U.S. Pat. Nos. 5,126,007; 5,492,611; 6,775,907). Additionally, the conductor patterns can be created utilizing one of several other exemplary methods (each discussed in more detail below):
1. Laser cured masking (curing of a mask layer on a metal film, and then etching);
2. Inkjet printing (of masking material or of seed material for subsequent metal plating);
3. Gravure printing (of a seed material for subsequent metal plating);
4. Micro-replication (form micro-grooves in a substrate, then fill with conductive material or with a seed material for subsequent metal plating); or,
5. Micro-contact printing (stamping or rotary printing of self-assembled monolayer (SAM) patterns on a substrate's surface).

Utilizing high volume, high resolution printing methods generally allow for precision placement of the conductive elements, and also allows for the (pseudo-random) variation of the conductors at a scale compatible with commercially available display pixels, to limit optical anomalies (for example moiré patterns) that might otherwise occur.

Laser cured masking can be used to create electrodes having a pattern of electrically isolated regions by selectively curing a pattern with an ultraviolet laser. Such a process typically works with either film—(for example, PET) or glass-based substrates. An exemplary laser cured masking process may include the following steps:
1. A substrate is plated with metal, (for example, silver or copper is sputter coated onto glass or PET film);
2. UV curable masking ink is coated uniformly onto the plated substrate, (for example, spin coating, and dip coating);
3. A laser cures a portion of the printed ink, to form electrodes in the active area of the touch sensor, and may also cure lines that interconnect electrodes to connector pads (beam width of the laser may be reduced by a photo mask);
4. Uncured ink is removed (washed off); and
5. Metal plated on the substrate is removed by etching, except for the pattern under the masking ink.

Inkjet Printing and plating of seed ink can be used to create electrodes by printing of the desired pattern using relatively wide lines of seed ink (catalytic ink), followed by selective curing with a UV laser, and similar to the laser cured masking process described above. The substrate for this process may be either film—(for example, PET) or glass.

In one exemplary process:
1. A Seed ink is inkjet printed onto a substrate;
2. A laser cures a portion of the printed ink, to form electrodes in active area(s) of the touch sensor, and may also cure lines that interconnect electrodes to connector pads (the beam width of the laser may be reduced by a photo mask);
3. Uncured ink is removed (washed off); and,
4. The cured pattern of seed ink is electroless plated, (with a conductive metal).

The inkjet printing process minimizes the amount of ink used, so it should be considered where inks are expensive, (for example, seed inks). If ink has relatively low cost, inkjet printing can be replaced by another process (for example, spin coating or dip coating) that coats the whole substrate uniformly. Ink material and processing for the Inkjet printing and plating of seed ink process described above are available from Conductive Inkjet Technology division of Carclo Technical Plastics, Cambridge, UK.

Gravure printing requires that the image to be printed is "etched" into a metal plate which rotates on a drum. As the drum turns, the etched surface is filled with ink which then gets deposited on the surface of the film being printed as the ink-filled etched plate and the film contact each other. The process can include a film substrate being printed with ink lines from an ink bath. An impression cylinder is rolled against a printing drum, which has etches that fill with ink from the inkbath. Such a process could be used to make material for later processing or could be used to make specific X or Y components of a high volume sensor.

Seed inks (or catalytic inks) may be printed by any of the methods described above. After printing and curing, the inks can be electroless plated with metals such as copper, resulting in high conductivity. Seed ink manufacturers include Conductive Inkjet Technology, a division of Carclo, located in Cambridge, UK and QinetiQ Company in Farnborough, England. Cabot Printable Electronics and Displays of Albuquerque, N. Mex. make inkjet printable silver conductive inks.

Micro-replication is yet another process that can be used to form the electrodes. Micro-replicated channels may be filled with seed ink and then plated (using a metallization layer) to make them conductive. Alternatively the channels could be filled with an ink that by itself is conductive, eliminating the need for the plating process. A third alternative is to coat the substrate with a metal, then mask the portions of metal in the (bottom of) the grooves, then etch away the unmasked metal, (see, for example, US Patent Publication Nos. 2011-0111182 and 2011-0100957). The actual shape of the channels can be altered to optimize the cross sectional shape and size that provides the lowest level of optical interference while still ensuring high conductivity and high production yields.

Filled micro-replicated channels can provide a conductor with a high aspect ratio cross section (relative to masked metal films). Thus maximum conductivity may be achieved with minimum optical visibility, (narrow cross section in the direction of viewing). A method of filling micro-replicated channels and desirable shapes of channels with high aspect ratio are described in co-assigned US Patent Publication No. US2007/0160811 (Gaides, et. al.).

Micro-contact printing is yet another process that can be used to form the electrodes. Micro-contact printing is the stamping or rotary printing of self-assembled monolayer (SAM) patterns on substrate surfaces. The approach exhibits several technologically important features, including the ability to be carried out for very fine scale patterns (e.g., feature size of one tenth of a micrometer) and with the extension of the patterned monolayer to the patterning of metals, ceramics, and polymers.

An exemplary micro-contact printing process is as follows:
1. A substrate is coated with metal, (for example, silver or copper is sputter coated or plated onto glass or PET film);
2. A self-assembled mono-layer mask is stamped onto the plated substrate; and,
3. Metal coated on the substrate is removed by etching, except for the pattern under the mask.

A micro-contact printing process is described in, for example, U.S. Pat. No. 5,512,131 (Kumar) and in co-pending Patent Publication No. 2009-0218310 (Zu). Micro-contact printing is generally substrate independent. For example, substrates can be PET, glass, PEN, TAC, or opaque plastic. As is known in the art, micro-contact printing can be combined with metal deposition processes to yield an additive patterning process (for example, including electroless plating).

FIGS. 5A-5H show various alternative distributed density electrode configurations. Each of these electrodes includes a plurality of electrically isolated regions located in different sections of the electrode. As mentioned above, the width of each individual section and number of sections can vary. The electrically isolated regions of each of the electrodes of FIGS. 5A-5H can have a shape or distribution density similar to that described above.

FIG. 5A shows an alternative distributed density electrode 200. In this configuration, electrode 200 includes a plurality of electrically isolated regions 215, 225 disposed in a repeating pattern between edges 204, 206. In this configuration, there are no electrically isolated regions disposed in the central section of electrode 200. A group of electrically isolated regions 215 are disposed in an edge section of the electrode 200 (i.e., a section bounded by an edge, here the right side is bounded by edge 204). In addition, the electrically isolated regions 225 are disposed partly within both an edge section and an intermediate section of electrode 200. Other sets of electrically isolated regions are formed in the other intermediate and edge sections, but are not identified for simplicity. In this manner, the edge sections of electrode 200 have less electrode conductor area than the neighboring intermediate sections. Similarly, since the center section has no electrically isolated regions, the intermediate section has less electrode conductor area than its neighboring central section, but more than its neighboring edge section. The electrically isolated regions 215, 225 can have varying shapes or patterns, such as those described above.

FIG. 5B shows another alternative distributed density electrode 300. In this configuration, electrode 300 includes a plurality of electrically isolated regions 315, 325 disposed in a repeating pattern between edges 304, 306. In this configuration, there are no electrically isolated regions disposed in the central section of electrode 300. A group of electrically isolated regions 315 are disposed in an edge section of the electrode 300 (i.e., a section bounded on one side by an edge, here the right side is bounded by edge 304). In addition, the electrically isolated regions 325 are disposed in an intermediate section of electrode 300. Other sets of electrically isolated regions are formed in the other intermediate and edge sections, but are not identified for simplicity. The electrically isolated regions 315 are larger than the electrically isolated regions 325. In this manner, the edge sections of electrode 300 have less electrode conductor area than the neighboring intermediate sections. Similarly, since the center section has no electrically isolated regions, the intermediate section has less electrode conductor area than its neighboring central section, but more than its neighboring edge section. The electrically isolated regions 315, 325 can have varying shapes or patterns, such as those described above.

FIG. 5C shows another alternative distributed density electrode 400. In this configuration, electrode 400 includes a plurality of electrically isolated regions 415, 425 disposed in a repeating pattern between edges 404, 406. In this configuration, there are no electrically isolated regions disposed in the central section of electrode 400. A group of electrically isolated regions 415 are disposed in an edge section of the electrode 400 (i.e., a section bounded on one side by an edge, here the right side is bounded by edge 404). In addition, the electrically isolated regions 425 are partly disposed both in an edge section and an intermediate section of electrode 400. Other sets of electrically isolated regions are formed in the other intermediate and edge sections, but are not identified for simplicity. The electrically isolated regions 415 are larger than the electrically isolated regions 425. In this manner, the edge sections of electrode 400 have less electrode conductor area than the neighboring intermediate sections. Similarly, since the center section has no electrically isolated regions, the intermediate section has less electrode conductor area than its neighboring central section, but more than its neighboring edge section. The electrically isolated regions 415, 425 can have varying shapes or patterns, such as those described above.

FIG. 5D shows another alternative distributed density electrode 500. In this configuration, electrode 500 includes a plurality of electrically isolated regions 515, 525a, 525b, 535 disposed in a repeating pattern between edges 504, 506. A group of electrically isolated regions 515 are disposed on the edge sections of the electrode 500 (here the electrically isolated regions 515 are disposed on edge 504). In addition, the electrically isolated regions 525a are partly disposed both in an edge section and an intermediate section of electrode 500 and electrically isolated regions 525b are disposed in an intermediate section. Other sets of electrically isolated regions are formed in the other intermediate and edge sections, but are not identified for simplicity. The electrically isolated regions 515 are larger than the electrically isolated regions 525a and 525b. In this manner, the edge sections of electrode 500 have less electrode conductor area than the neighboring intermediate sections. The center section of electrode 500 includes electrically isolated regions 535, which have a size at least as large as the electrically isolated regions 525a and 525b, but are distributed more sparsely. The intermediate section has less electrode conductor area than its neighboring central section, but more than its neighboring edge section. The electrically isolated regions 515, 525a, 525b, 535 can have varying shapes or patterns, such as those described above.

FIG. 5E shows another alternative distributed density electrode 600. In this configuration, electrode 600 includes a plurality of electrically isolated regions 615a, 625a, 625b, 635 disposed in a repeating pattern between edges 604, 606. In this configuration, a group of electrically isolated regions 615a are formed as part of edge 604, whereby the edge 604 is not a substantially straight line shape as in other aspects of the invention. In this manner, there is less electrode conductor area in the edge sections than in the intermediate sections or central sections of electrode 600. In addition, the electrically isolated regions 625a are partly disposed both in an edge section and an intermediate section of electrode 600 and electrically isolated regions 625b are disposed in an intermediate section. Other sets of electrically isolated regions are formed in the other intermediate and edge sections, but are not identified for simplicity. The electrically isolated regions 615 are larger than the electrically isolated regions 625a and 625b. The center section of electrode 600 includes electrically isolated regions 635, which have a size at least as large as the electrically isolated regions 625a and 625b, but are distributed more sparsely. The intermediate section has less electrode conductor area than its neighboring central section, but more than its neighboring edge section. The electrically isolated regions 615a, 625a, 625b, 635 can have varying shapes or patterns, such as those described above.

FIG. 5F shows another alternative distributed density electrode 700. In this configuration, electrode 700 includes a plurality of electrically isolated regions 715, 725, 735 disposed in a repeating pattern between edges 704, 706. A group of electrically isolated regions 715 are disposed on the edge sections of the electrode 700 (here the electrically isolated regions 715 are disposed on edge 704). In addition, the electrically isolated regions 725 are disposed in an intermediate section. The center section of electrode 700 includes electrically isolated regions 735, which are smaller in size than the electrically isolated regions 715 and 725. Other sets of electrically isolated regions are formed in the other intermediate and edge sections, but are not identified for simplicity. The electrically isolated regions 715 are larger than the electrically isolated regions 725 and 735. In this manner, the edge sections of electrode 700 have less electrode conductor area than the neighboring intermediate sections. The intermediate section has less electrode conductor area than its neighboring central section, but more than its neighboring edge section. The electrically isolated regions 715, 725, and 735 can have varying shapes or patterns, such as those described above.

Figure 5H:
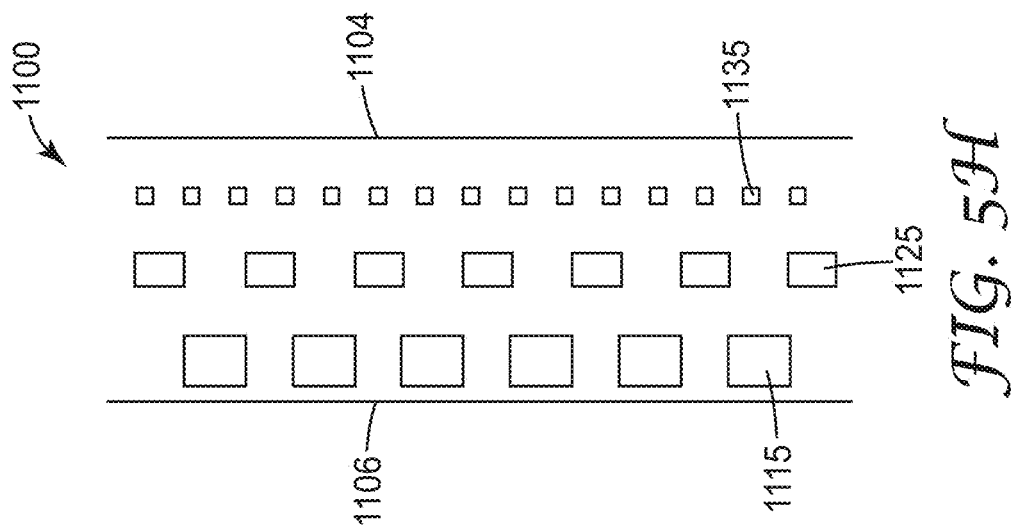
FIG. 5H is a front view of an electrode according to another aspect of the invention.
Figure 5G:
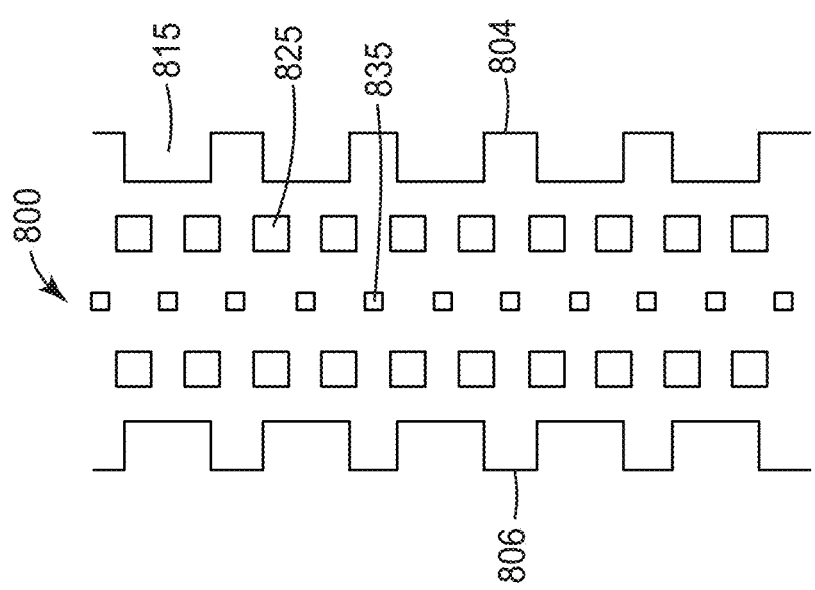
FIG. 5G is a front view of an electrode according to another aspect of the invention.

FIG. 5G shows another alternative distributed density electrode 800. In this configuration, electrode 800 includes a plurality of electrically isolated regions 815, 825, 835 disposed in a repeating pattern between edges 804, 806. In this configuration, a group of electrically isolated regions 815 are formed as part of edge 804, whereby the edge 804 is not a substantially straight line shape as in other aspects of the invention. In this manner, there is less electrode conductor area in the edge sections than in the intermediate sections or central sections of electrode 800. In addition, the electrically isolated regions 825 are disposed in an intermediate section. The center section of electrode 800 includes electrically isolated regions 835, which are smaller in size than the electrically isolated regions 815 and 825. Other sets of electrically isolated regions are formed in the other intermediate and edge sections, but are not identified for simplicity. The electrically isolated regions 815 are larger than the electrically isolated regions 825. The intermediate section has less electrode conductor area than its neighboring central section, but more than its neighboring edge section. The electrically isolated regions 815, 825, 835 can have varying shapes or patterns, such as those described above.

FIG. 5H shows another alternative distributed density electrode 1100. In this configuration, electrode 1100 includes a plurality of electrically isolated regions 1115, 1125, 1135 disposed in a repeating pattern. Unlike the other embodiments described above, electrode 1100 has an uneven distribution of electrically isolated regions from one edge to the other edge. In this example, the edge section nearest edge 1106 has a greater concentration of electrically isolated regions than the edge section nearest edge 1104. In this manner, this particular electrode design is suitable for positioning as an end electrode of an electrode layer. In particular, electrode 1100 could be utilized as the edge electrode, where edge 1104 is disposed at or near the right-most end of a touch screen sensor. Similarly, if the orientation of electrode 1100 were flipped, the electrode 1100 could be utilized at or near the left-most end of a touch screen sensor. In this configuration, a group of electrically isolated regions 1115 are formed nearest edge 1104. In this manner, there is less electrode conductor area in the edge section nearest edge 1106 than in the intermediate sections or central sections of electrode 1100. In addition, the electrically isolated regions 1115 are at least partly disposed in an intermediate section. The center section of electrode 1100 includes electrically isolated regions 1125, which are smaller in size than the electrically isolated regions 1115. In this configuration, electrically isolated regions 1135 are disposed at least partly in the intermediate section nearest edge 1104, whereas the edge section nearest edge 1104 does not include any electrically isolated regions. Accordingly, in this configuration, there is more electrode conductor area in the edge section nearest edge 1104. The electrically isolated regions 1115, 1125, 1135 can have varying shapes or patterns, such as those described above.

In addition, in some aspect of the invention, the electrode layer of a touch screen sensor can include some electrodes of one particular configuration (e.g., electrodes configured like electrode 200) and one or more other electrodes of another particular configuration (e.g. an electrode(s) configured like electrode 1100).

Figure 6:
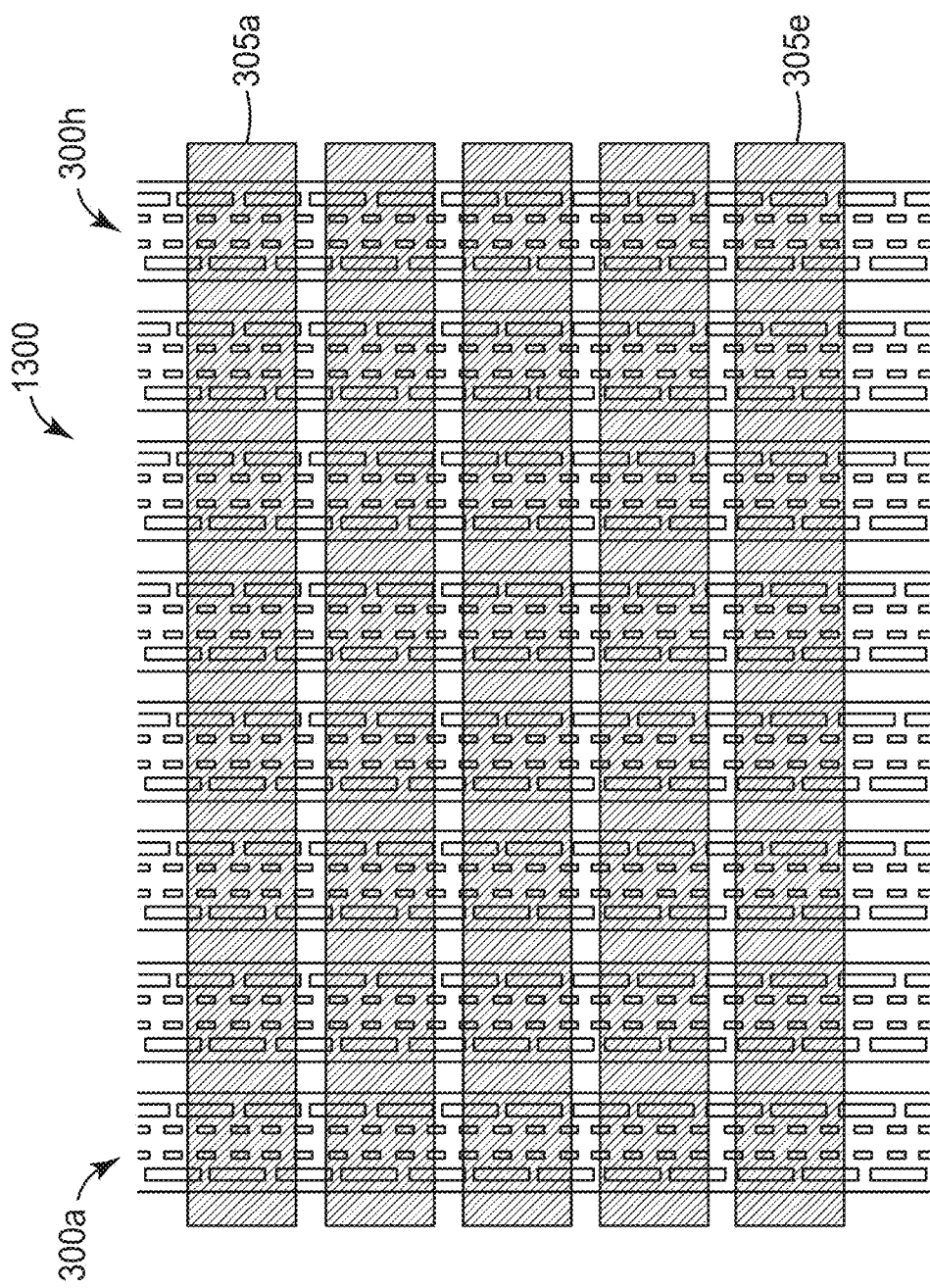
FIG. 6 is an illustration of the first and second electrode layers of a touch sensor according to another aspect of the invention.

As mentioned above, the distributed density electrode designs described herein can be implemented as part of a touch sensor for a display device. FIG. 6 illustrates an array of a horizontal (drive) electrode and vertical (receive) electrode arrayed in two layers to form a touch sensor 1300. This touch sensor construction provides for "all points addressable" capability, having a matrix structure made of two orthogonal, electrically isolated sets of parallel electrodes. In this arrangement, the vertical (receive) electrode layer includes a plurality of electrodes 300a-300h having a structure similar to that described above with respect to electrode 300 shown in FIG. 5B. Of course, electrodes 100, 200, 400, 500, 600, 700, and 800 can also be utilized as a receive electrode. The drive electrodes comprise electrodes 305a-305e. In addition, in this particular arrangement, only the receive (vertical) electrodes include a distribution of electrically isolated regions, while the drive (horizontal) electrodes can have a more uniform structure. In other embodiments either or both the drive and receive electrodes may include a distribution of electrically isolated regions. In another embodiment a horizontal (drive) electrode can comprise across its width at least one edge section, at least one intermediate section, and at least one central section, wherein an intermediate section is disposed along the electrode width between an edge section and the central section. Each electrode edge section and intermediate section can include a plurality of electrically isolated regions arranged in a pattern along the electrode length. An electrode conductive area of the edge section is less than an electrode conductive area of the intermediate section.

The distribution of electrically isolated regions can be the same or quite different on the two electrode layers. In addition, the distribution of the horizontal (drive) electrode can vary down the length of the electrode to change the pattern under the vertical (receive) electrode.

The two layers comprising the horizontal (drive) electrode and vertical (receive) electrode can be patterned onto the same surface of a transparent substrate or they may be patterned onto opposite sides of the same substrate. In other embodiments the two layers can be patterned onto separate substrates which are then laminated together with an adhesive.

Figure 8:
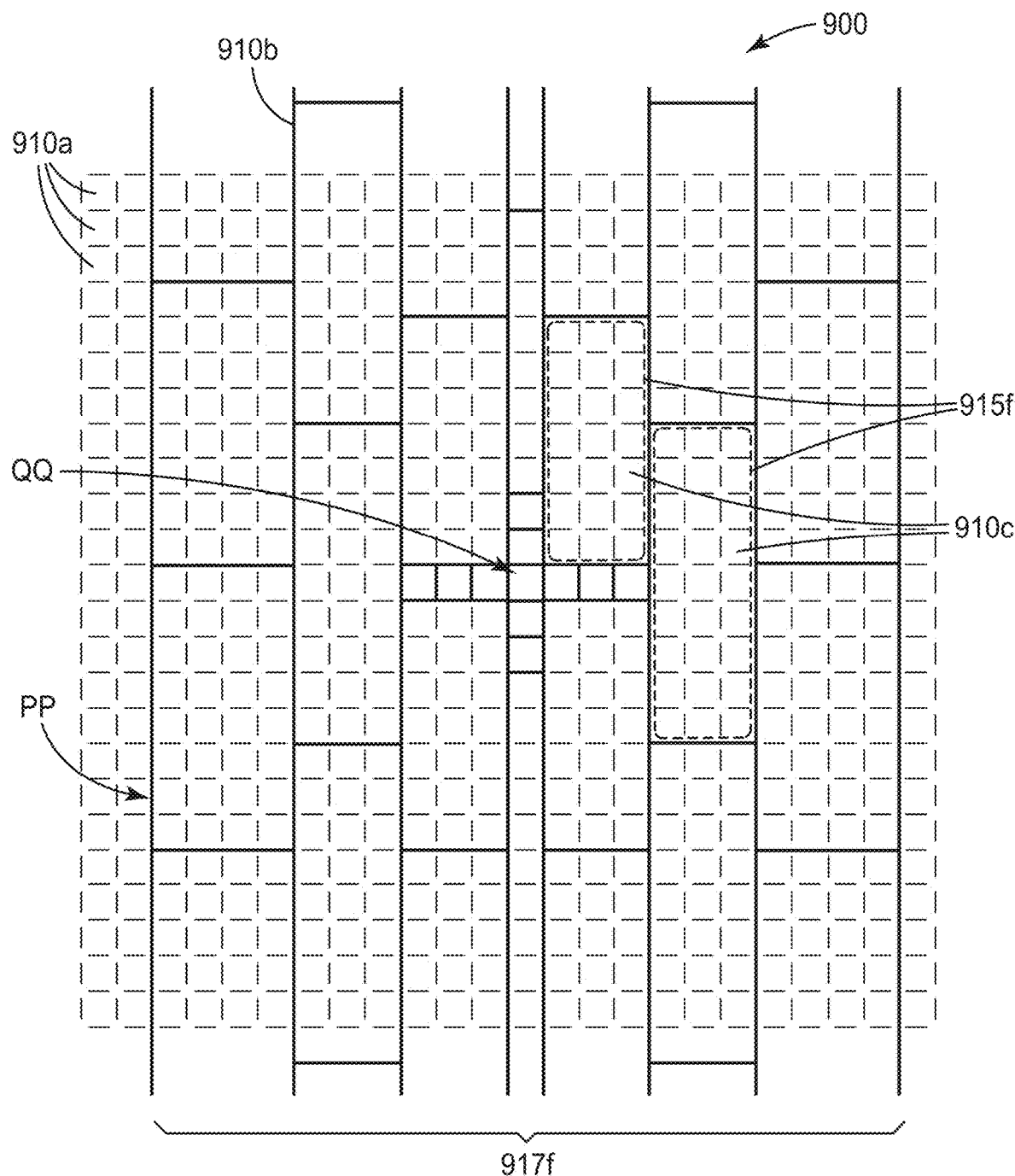
FIG. 8 is a view of a micro-wired based electrode arrangement according to another aspect of the present invention.

While the above electrode designs are generally formed using a metal, or a transparent oxide material, such as indium tin oxide (ITO), or a transparent conducting organic material (e.g. PEDOT), the electrodes of the present invention can also be formed from a mesh pattern of conductive materials. For example, FIG. 8 illustrates a further embodiment of an electrode configuration that includes a pattern of electrically isolated regions. The sensor electrode 900 of FIG. 8 is built from coincident micropatterns, including a first pattern comprised of a first mesh with first characteristic average cell spacing, and a second pattern adapted from the network of the first pattern, where the second pattern comprises conductive electrode 917f, and a third pattern that comprises interior regions 915f in electrode 917f, the interior regions having a variety of different sizes and shapes. The micro-wires that define the cells of the second pattern are all provided without breaks and are continuously conductive. The interior regions 915f of electrode 917f are rendered electrically discontinuous and isolated from electrode 917f and non-conductive by means of breaks in the pattern along the length of the micro-wires. A further description of forming electrically discontinuous wire patterns is provided in U.S. patent application Ser. No. 13/689,935, incorporated by reference herein in its entirety.

The cell spacings of the second pattern in the electrode shown with respect to FIG. 8 vary with position along the sensor. Near the left and right edges of FIG. 8, the edge sections, the cells of the conductive second pattern are 4 times larger than the cells of the underlying mesh pattern. Nearer the vertical center line of FIG. 8, the intermediate sections of the electrode, the cells of the second pattern are only three times that of the first pattern. The cells that comprise the superstructure second pattern in FIG. 8 are rectangular. For instance the super-structure cell marked "PP" has a width along the horizontal of four times the cell dimension of the underlying mesh and a height along the vertical of eight times the cell dimension of the underlying mesh.

An approximately rectangular super-structure cell can still be formed by bounding a collection of underlying hexagonal cells that are approximately four hexagonal cell widths wide and eight hexagonal cell widths tall. In an embodiment where the mesh of the first pattern is formed from a pseudo-random network of micro-wires, the conductive second pattern can also be designed as a pseudo-random network of micro-wires. In this random embodiment the average distance between wires in the conductive second pattern do not need to be equal along two orthogonal directions.

Along the center line of FIG. 8, a conductive trunk in the second pattern is shown. This conductive trunk is comprised of the outlines of single-wide and neighboring mesh cells along the vertical axis. The lateral micro-wires that comprise the interior regions according to the third pattern of this central column of conductive cells are maintained as broken traces.

For the super-structure conductive mesh of FIG. 8 a variation in capacitance has been provided as a function of position along the sensor electrode. An apparent localized center point of the sensor electrode is located at the QQ position. The density of the super-structure conductive mesh falls off as a pointing object moves horizontally away from a vertical line through the QQ position to either the left or the right. As the finger moves vertically away from a horizontal line through QQ, however, the density of the super-structure mesh changes very little. The density of the superstructure mesh therefore does not have an isotropic variation with distance from the center-point QQ. Instead the super-structure shown in the electrode of FIG. 8 is designed to present a density variation which has mirror symmetry about the vertical centerline.

The cell spacings shown for the conductive second pattern of the electrode in FIG. 8 vary as a function of position along the width of the electrode. It will be recognized by those skilled in the art that the electrode conductive area also varies across the electrode in inverse proportion to its variation in cell spacing. The conductive area of the edge section in FIG. 8 is less than that of the intermediate section.

Figure 9:
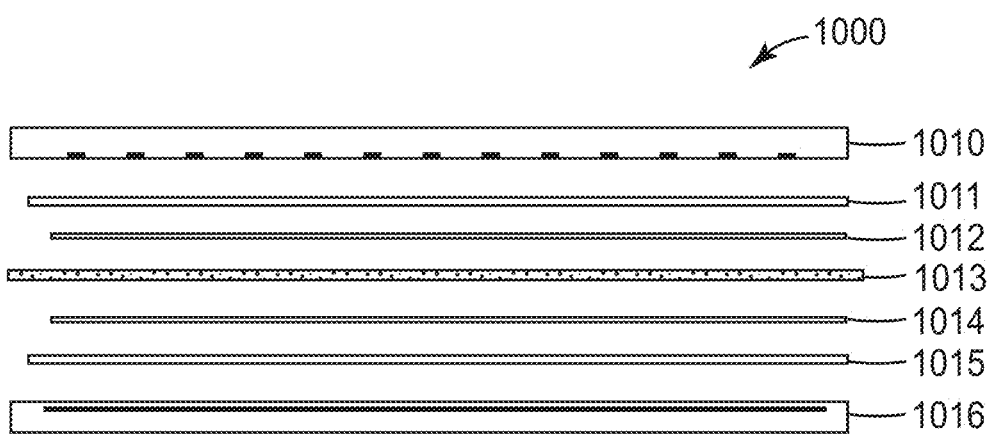
FIG. 9 is a cross section of an example of a matrix touch sensor constructed from at least one electrode layer in accordance with the present invention.

FIG. 9 shows a cross section of an example of a matrix touch sensor constructed with at least one electrode layer having a pattern of electrically isolated regions. The embodiment shown in FIG. 9 includes two electrode layers, shown as layer 1010 and layer 1016. The topmost layer 1010 (also referred to as a first electrode layer) can include an electrode layer constructed similar to the electrode layers described above, such as electrodes 100, 200, 300, 400, 500, 600, 700,

800, 900 and 1100. The topmost layer 1010 is the layer positioned closest to the detection object, for instance closest to a finger or stylus. In one embodiment the top layer includes an array of vertical (receive) electrodes such as are shown in electrodes 300*a* to 300*h*. As shown in FIG. 9, the electrodes on the layer 1010 are seen end-on, and the electrodes on the bottom layer 1016 are seen from the side. The electrodes of the bottom layer can include an array of horizontal (drive) electrodes such as are shown in electrodes 305*a*-305*e*. The "electrode lines" on 1016 are shown solid because the lower electrodes are orthogonal to the upper electrodes.

The electrodes of the topmost layer 1010 (and similarly for electrodes on the bottom layer 1016) are disposed onto a light transmissive substrate, preferably a flexible substrate. As described above, suitable substrates include thin sheets of PET or other polymeric materials. An exemplary PET substrate is ST504 PET from DuPont, Wilmington, Del., measuring approximately 125 micrometers in thickness, although other thicknesses can be employed.

In the example of FIG. 9, the electrode layer 1010 is shown positioned on the bottom surface of its corresponding substrate. In an alternate embodiment the electrode layer can be disposed onto the top surface of the substrate, i.e. on the surface closest to the object to be detected.

Disposed below layer 1010, the next layer 1011 comprises a patternable dielectric material. A suitable dielectric can be a UV-cured acrylate material that is solution-coated onto the surface of the electrodes of layer 1010. The dielectric material 1011 can be patterned to provide openings to facilitate the connection of leads to the electrode layer 1010.

Disposed below layer 1011, the next layer 1012 comprises a layer of post-processed conductors. The post-processed conductor layer 1012 (and similarly layer 1014) may be a screen-printed (or ink jetted) conductive lead at the edge of the sensor, such as a silver ink used to connect the ends of the electrodes to the sensor circuits. These leads are typically at the edge of the sensor, outside of the viewing area, because they are opaque. The post-processed conductive leads of layer 1012 and 1014 connect each of the plurality of electrodes in layers 1010 and 1016, respectively, to a connection point on a touch-sensing control circuit. In a preferred embodiment the conductive leads 1012 and 1014 are connected to a flexible printed circuit (FPC, not shown). The conductor leads of the FPC can be attached to the leads of layer 1012 and layer 1016 by means of an anisotropic conductive adhesive (not shown).

Disposed below layer 1012, the next layer 1013 comprises an adhesive, such as an optically clear adhesive. A suitable optically clear adhesive is Optically Clear Laminating Adhesive 8141 from 3M Company, St. Paul, Minn.

Disposed below layer 1013, the next layer 1014 comprises a layer of a post-processed conductors. Layer 1014 can be formed as described above with respect to layer 1012. Disposed below layer 1014, the next layer 1015 comprises a patternable dielectric. Layer 1015 can be formed as described above with respect to layer 1011.

Disposed below layer 1015, the final layer 1016 can comprise a second electrode layer. Layer 1016 can include an electrode layer constructed similar to the electrode layers described above, such as electrodes 100, 200, 300, 400, 500, 600, 700, 800, and 900. Layer 1016 can have a plurality of individual electrodes in order to make a matrix-addressable sensor. However, each electrode in layer 1016 can comprise a conductive strip with no electrically isolated regions within the boundary of the electrode strip.

In the example shown, the electrode layer 1016 is shown positioned on the top surface of its corresponding substrate. In an alternate embodiment the electrode layer can be disposed onto the bottom surface of the substrate, i.e. on the surface furthest away from the object to be detected.

The embodiment of FIG. 9 is one in which each of the two electrode layers is disposed on its own flexible substrate, the two substrates then being laminated together by means of the optically clear adhesive 1013. In an alternate embodiment, the two electrode layers 1010 and 1016 can be disposed onto opposite surfaces of the same substrate, in which case no adhesive layer 1013 is required.

A multilayer touch sensor can be formed as follows. First and second patterned electrodes/substrates can be adhered together using an optically clear adhesive, such as Optically Clear Laminating Adhesive 8141 from 3M Company, St. Paul, Minn., to yield a multilayer construction. A handheld roller can be used to laminate the two patterned substrates with certain regions of the conductive traces being adhesive free. The multilayer construction can be laminated to a substrate, such as a thick float glass using Optically Clear Laminating Adhesive 8141 such that the topmost electrode layer (e.g., layer 1010) is proximate to the float glass. Adhesive free conductive trace regions can be electrically connected to the first and second patterned substrates.

Integrated circuits can be used to make mutual capacitance measurements of the transparent sensor element. For example, PIC18F87J10 (Microchip Technology, Chandler, Ariz.), AD7142 (Analog Devices, Norwood, Mass.), and MM74HC154WM (Fairchild Semiconductor, South Portland, Me.) circuits can be used. The PIC18F87J10 can be used as a microcontroller for the system. This circuit can control the selection of sensor bars which the MM74HC154WM circuit drives. The AD7142 circuit can also be configured to make the appropriate measurements. Calibration values can be set, as is known in the art. These calibration values can vary from touch screen to touch screen. Such a system could drive 16 different bars and the AD7142 circuit can measure 12 different bars. The configuration of the AD7142 can include selection of the number of channels to convert, how accurately or quickly to take measurements, if an offset in capacitance should be applied, and the connections for the analog to digital converter. The measurement from the AD7142 can be a 16 bit value representing the capacitance of the cross point between conductive bars in the matrix of the transparent sensor element.

After the AD7142 completes its measurements, it can signal the microcontroller, via an interrupt, to tell it to collect the data. The microcontroller can then collect data over an SPI port. After the data is received, the microcontroller can increment the MM74HC154WM circuit to the next drive line and clear the interrupt in the AD7142 signaling it to take the next set of data. As the sampling from above can be constantly running, the microcontroller can also send the data to a computer with monitor via a serial interface. This serial interface can allow a simple computer program, as are known to those of skill in the art, to render the raw data from the AD7142 circuit and see how the values change between a touch and no touch. The computer program, for example, can render different colors across the display, depending on the value of the 16 bit value. When the 16 bit value is below a certain value, based on the calibration, the display region can be rendered white. Above that threshold, based on the calibration, the display region can be rendered green. The data can be sent asynchronously in the format of a 4 byte header (0xAAAAAAAA), one byte channel (0x00-0x0F), 24 bytes of data (represents the capacitive measurements), and carriage return (0x0D).

One skilled in the art will appreciate that the present invention can be practiced with embodiments other than those disclosed. The disclosed embodiments are presented for purposes of illustration and not limitation, and the present invention is limited only by the claims that follow.

The invention claimed is:

1. An electrode having a width and extending along a length of the electrode, the electrode patterned to have a plurality of electrically isolated regions such that a conductivity of the electrode along the length of the electrode is different at two different locations along the width of the electrode.

2. The electrode of claim 1, wherein the width of the electrode is substantially constant.

3. The electrode of claim 1, wherein the electrode includes a central section, a first edge section and a first intermediate section between the central section and the first edge section.

4. The electrode of claim 3, wherein a conductivity of the first intermediate section is higher than a conductivity of the first edge section.

5. The electrode of claim 4, wherein a conductivity of the central section is higher than a conductivity of the first intermediate section.

6. The electrode of claim 3, wherein a conductivity of the central section is higher than a conductivity of the first intermediate section.

7. The electrode of claim 3, further comprising a second edge section and a second intermediate section between the second edge section and the central section.

8. The electrode of claim 7, wherein a conductivity of the first intermediate section is higher than a conductivity of the first edge section, and a conductivity of the second intermediate section is higher than a conductivity of the second edge section.

9. The electrode of claim 8, wherein a conductivity of the central section is higher than each of the conductivities of the first and second intermediate sections.

10. The electrode of claim 9, wherein each electrically isolated region in the plurality of electrically isolated regions comprises a plurality of discontinuous micro-wire conductors.

11. The electrode of claim 10, wherein the plurality of electrically isolated regions comprise electrically isolated regions in each of the first and second edge sections and the first and second intermediate sections arranged in a pattern along the length of the electrode.

12. The electrode of claim 11, further comprising continuously conductive micro-wires.

13. The electrode of claim 12, wherein the continuously conductive micro-wires are disposed in electrode conductive areas of the central section, the first and second intermediate sections, and the first and second edge sections.

14. The electrode of claim 1, wherein each electrically isolated region in the plurality of electrically isolated regions comprises a plurality of discontinuous micro-wire conductors.

15. The electrode of claim 14, further comprising continuously conductive micro-wires.

16. A touch screen sensor comprising an electrode layer having a plurality of substantially parallel electrodes, wherein at least one of the substantially parallel electrodes is an electrode according to claim 1.

* * * * *

UNITED STATES PATENT AND TRADEMARK OFFICE
CERTIFICATE OF CORRECTION

PATENT NO. : 10,838,559 B2
APPLICATION NO. : 15/350297
DATED : November 17, 2020
INVENTOR(S) : Roger Barton et al.

It is certified that error appears in the above-identified patent and that said Letters Patent is hereby corrected as shown below:

In the Specification

Column 8
Line 63, Delete "50″″")," and insert -- 50′″"), --, therefor.

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*